United States Patent
Contreras et al.

(10) Patent No.: US 11,456,022 B2
(45) Date of Patent: Sep. 27, 2022

(54) DISTRIBUTED GROUPED TERMINATIONS FOR MULTIPLE MEMORY INTEGRATED CIRCUIT SYSTEMS

(71) Applicant: Western Digital Technologies, Inc., San Jose, CA (US)

(72) Inventors: John Thomas Contreras, Palo Alto, CA (US); Srinivas Rajendra, Milpitas, CA (US); Sayed Mobin, San Jose, CA (US); Rehan Ahmed Zakai, San Ramon, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 88 days.

(21) Appl. No.: 16/916,945

(22) Filed: Jun. 30, 2020

(65) Prior Publication Data

US 2021/0407565 A1    Dec. 30, 2021

(51) Int. Cl.
*G11C 16/04*    (2006.01)
*G11C 7/10*    (2006.01)
(Continued)

(52) U.S. Cl.
CPC .......... *G11C 7/1048* (2013.01); *G06F 3/0604* (2013.01); *G06F 3/0659* (2013.01);
(Continued)

(58) Field of Classification Search
CPC ... G11C 7/1048; G06F 3/0604; G06F 3/0659; G06F 3/0679; H01L 25/0657; H01L 2225/06506; H01L 2225/0651
See application file for complete search history.

(56) References Cited

U.S. PATENT DOCUMENTS 6,026,456 A    2/2000    Ilkbahar
6,356,106 B1    3/2002    Greeff et al.
(Continued)

FOREIGN PATENT DOCUMENTS

EP    1129520 B1    7/2003

OTHER PUBLICATIONS

Altera, "Basic Principles of Signal integrity", white paper, Altera Corporation, 2007.
(Continued)

*Primary Examiner* — Pho M Luu
(74) *Attorney, Agent, or Firm* — Patterson + Sheridan, LLP; Steven H. VerSteeg

(57) ABSTRACT

The present disclosure generally relates to apparatuses and methods for transmission line termination. In one embodiment an apparatus includes a stack of uniform memory dies and a storage controller. Each uniform memory die in the stack of uniform memory dies couples to a transmission line in series through wire bonds to form a transmission path. Each memory die includes an on-die termination resistance circuit connected to the transmission line. The on-die termination resistance circuit provides a minimum termination resistance. The storage controller addresses a target uniform memory die of the stack of uniform memory dies for an operation. The storage controller enables the on-die termination resistance circuits of a plurality of uniform memory dies along the transmission path. The storage controller transmits a data signal for the operation to the target uniform memory die with the on-die termination resistance circuit enabled for the plurality of uniform memory dies.

20 Claims, 17 Drawing Sheets

(51) Int. Cl.
*H03K 19/00* (2006.01)
*H01L 25/065* (2006.01)
*G06F 3/06* (2006.01)

(52) U.S. Cl.
CPC ........ *G06F 3/0679* (2013.01); *H01L 25/0657* (2013.01); *H03K 19/0005* (2013.01); *H01L 2225/0651* (2013.01); *H01L 2225/06506* (2013.01)

(56) References Cited

U.S. PATENT DOCUMENTS

| | | | |
|---|---|---|---|
| 6,514,794 B2 | 2/2003 | Haba et al. | |
| 6,621,155 B1 | 9/2003 | Perino et al. | |
| 7,005,939 B2 | 2/2006 | Zerbe et al. | |
| 7,795,905 B2 | 9/2010 | Sohn | |
| 8,688,955 B2 | 4/2014 | Grunzke | |
| 8,929,119 B2 | 1/2015 | Lee et al. | |
| 8,930,647 B1 * | 1/2015 | Smith | G06F 30/392 711/154 |
| 9,245,825 B2 | 1/2016 | Ramachandra et al. | |
| 10,074,423 B1 * | 9/2018 | Hermesh | H01L 25/0657 |
| 10,270,441 B2 | 4/2019 | Nguyen et al. | |
| 10,283,200 B2 | 5/2019 | Hermesh et al. | |
| 10,468,073 B2 * | 11/2019 | Contreras | H01L 25/0657 |
| 10,637,533 B2 | 4/2020 | Contreras et al. | |
| 10,643,676 B2 * | 5/2020 | Mobin | G11C 7/1006 |
| 2003/0190849 A1 | 10/2003 | Deas et al. | |
| 2004/0034751 A1 | 2/2004 | Horn et al. | |
| 2004/0137542 A1 | 7/2004 | Petyaev | |
| 2005/0285262 A1 | 12/2005 | Knapp et al. | |
| 2006/0091900 A1 | 5/2006 | Kang et al. | |
| 2008/0030286 A1 | 2/2008 | Park et al. | |
| 2010/0136835 A1 | 6/2010 | Hashim et al. | |
| 2010/0327902 A1 | 12/2010 | Shau | |
| 2013/0031326 A1 | 1/2013 | Grunzke | |
| 2014/0036471 A1 | 2/2014 | Yuen et al. | |
| 2014/0177189 A1 | 6/2014 | Liu et al. | |
| 2014/0192583 A1 | 7/2014 | Rajan et al. | |
| 2015/0279444 A1 | 10/2015 | Vergis et al. | |
| 2017/0098469 A1 | 4/2017 | Park | |
| 2018/0026634 A1 | 1/2018 | Park et al. | |
| 2018/0261286 A1 | 9/2018 | Hermesh | |
| 2019/0050352 A1 | 2/2019 | Yun et al. | |
| 2020/0065270 A1 | 2/2020 | Mobin et al. | |
| 2020/0098728 A1 | 3/2020 | Xing et al. | |
| 2020/0105318 A1 | 4/2020 | Mobin et al. | |
| 2020/0106478 A1 | 4/2020 | Contreras et al. | |

OTHER PUBLICATIONS

Banas, David, Using Digitally Controlled Impedance: Signal integrity vs. Power Dissipation Considerations, Xilinx Application note XAPP836, Jun. 1, 2007, Entire Document.

Harkness, Samuel, Jeffrey Meirhofer, and Brock J. LaMeres, Controlled Impedance Chip-to-Chip Interconnect Using Coplanar Wire Bond Structures, Department of Electrical and Computer Engineering, Montana State University, Bozeman, MT.

M. Facchini et al., "System-level power/performance evaluation of 3D stacked DRAMs for mobile applications," 2009 Design, Automation & Test in Europe Conference & Exhibition, Nice, 2009, pp. 923-928.

Mechaik, Mehdi M., An Evaluation of Single-Ended and Differential Impedance in PCBs, IEEE, 2001, pp. 301-306 Feb. 1, 2001.

Raghavan, G. White Paper: Five Emerging DRAM Interfaces You Should Know for your Next Design. Cadence Design Systems, White Paper. Retrieved from the Internet.

Wadell, "Introduction to Common Printed Circuit Transmission Lines", Application note 2093, Jun. 29, 2003, Maxim Integrated Products.

\* cited by examiner

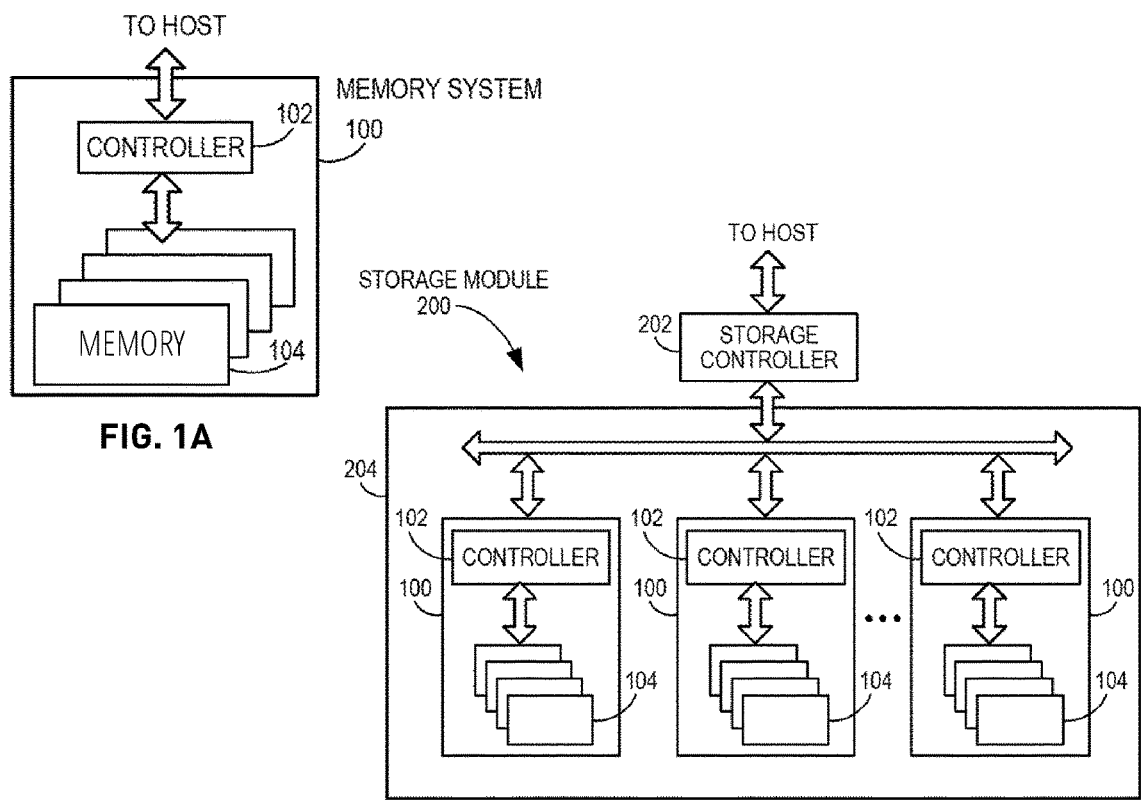
FIG. 1A
FIG. 1B
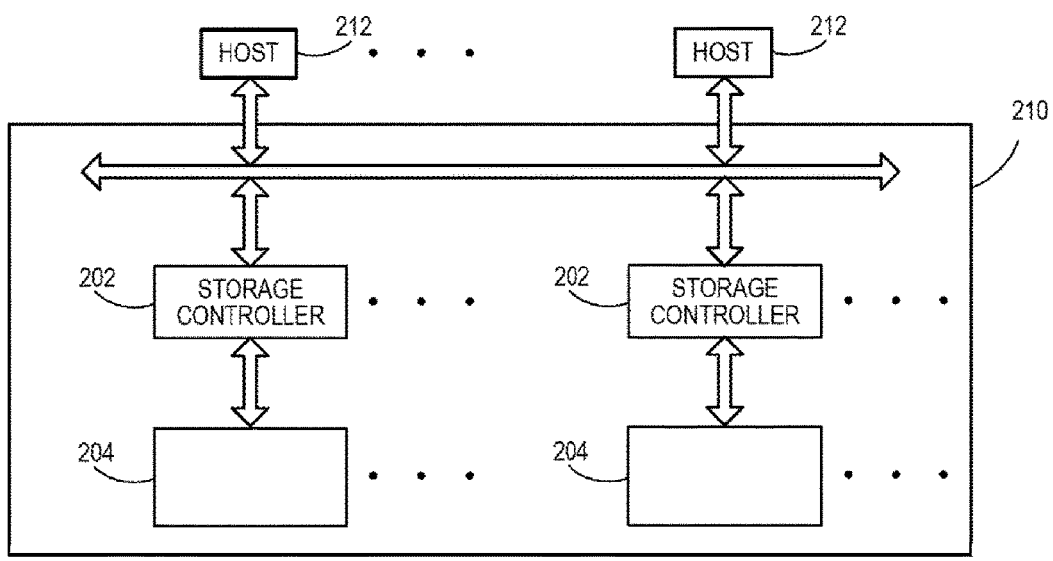
FIG. 1C

DISTRIBUTED GROUPED TERMINATIONS FOR MULTIPLE MEMORY INTEGRATED CIRCUIT SYSTEMS

CROSS-REFERENCE TO RELATED PATENTS

This application relates to U.S. Pat. No. 10,468,073 filed Dec. 29, 2017 and U.S. Pat. No. 10,637,533 filed Sep. 28, 2018.

BACKGROUND

A memory system may communicate signals carrying data, command, or clocking information for the storage of data within the memory system. The signals may be communicated along transmission paths that each have an overall characteristic impedance. Within a single transmission path, different portions or segments may have their own characteristic impedance, which contributes to the overall characteristic impedance of the transmission path. In general, it may be desirable for each of these different portions or segments to have the same characteristic impedance or as close to the same characteristic impedance as possible. Conversely, different or substantially different characteristic impedances between two or more of the different portions can lead to undesirable energy reflection, leading to degradation in signal integrity and ultimately performance. Where impedance mismatches do occur, ways to mitigate these impedance mismatches may be desirable.

One way to address this is by using end-die signal termination. Using end-die signal termination, however, may incur increased parasitic capacitance on the input/output (IO) signal. Further, certain proposals may require end-die signal termination using an electronic component specially configured to provide signal electrical termination. However, such proposals complicate manufacturing, assembly, and quality control processes. Manufacturing is more efficient and incurs fewer errors when the components (memory dies) are all uniform, or of the same design and manufacture (uniform memory die).

Therefore, there is a need for a transmission path termination solution that may be implemented using uniform memory die installed on a printed circuit board. There is a further need for this transmission path termination solution to be implemented in a way that does not incur a detrimental increase in parasitic capacitance on the IO signal (data signal). The claimed and disclosed embodiments address these needs.

BRIEF SUMMARY

This disclosure relates to an apparatus providing transmission line termination. The disclosed embodiments include electronic components (such as memory dies and/or on-die termination resistance circuits) configured to provide a minimum termination resistance as long as the electronic components are connected to the transmission path regardless of whether the electronic components are powered on or enabled. In addition, certain embodiments include electronic components having active resistance circuits coupled in parallel to the transmission path to manage termination resistance.

The apparatus comprises a stack of uniform memory dies and a storage controller. The stack of uniform memory dies is coupled to a transmission line by a set of wire bonds that connect each uniform memory die of the stack of uniform memory dies in series to form a transmission path. Each memory die of the comprises an on-die termination resistance circuit connected to the transmission line. The on-die termination resistance circuit provides a minimum termination resistance. The storage controller addresses a target uniform memory die of the for an operation. The storage controller enables the on-die termination resistance circuits of a plurality of uniform memory dies along the transmission path. The storage controller transmits a data signal for the operation to the target uniform memory die with the on-die termination resistance circuit enabled for the plurality of uniform memory dies.

This disclosure further relates to an apparatus providing transmission line termination comprising a and a storage controller. The couples to a transmission line by a set of wire bonds that connect each uniform memory die of the in series to form a transmission path Each uniform memory die comprises an on-die termination resistance circuit that connects to the transmission line when a uniform memory die is powered on. The on-die termination resistance circuit comprises a programmable resistance circuit providing a termination resistance during transmission of a data signal to a target uniform memory die. The storage controller sends a storage command to a target uniform memory die of the for an operation. The storage controller directs at least four uniform memory dies along the transmission path to provide termination resistance during the operation. The at least four uniform memory dies are different from the target uniform memory die. The storage controller transmits a plurality of data signals for the operation to the target uniform memory die with the at least four uniform memory dies generating an effective termination resistance for the transmission path during the operation.

Finally, this disclosure relates to a method for providing transmission line termination. A storage command is sent to a target uniform memory die of a for an operation. The is connected in series to a transmission line by wire bonds to form a transmission path. An on-die termination resistance circuit of at least four adjacent uniform memory dies along the transmission path is activated to provide an effective termination resistance lower than a minimum termination resistance of each of the on-die termination resistance circuits individually. The at least four uniform memory dies are different from the target uniform memory die. Data signals are transmitted for the operation to the target uniform memory die with the at least four uniform memory dies providing parallel termination resistance during the operation.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

FIG. 1A is a block diagram of an example memory system.

FIG. 1B illustrates a storage module of an example memory system.

FIG. 1C is a block diagram illustrating a hierarchical storage system.

DETAILED DESCRIPTION

Figure 2A:
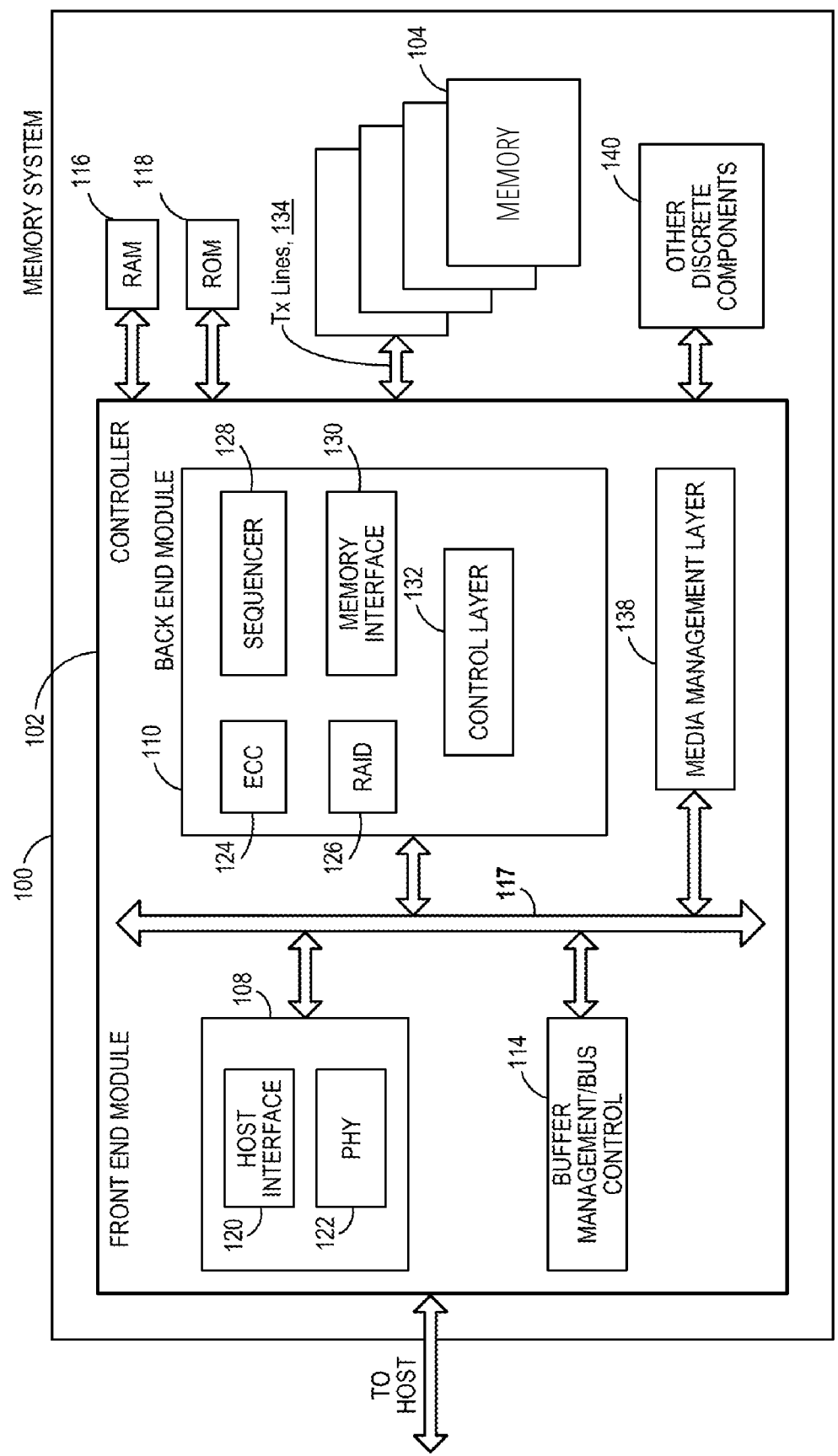
FIG. 2A is a block diagram of example components of a controller of an example memory system.

The effective impedance of a transmission path may be reduced as disclosed herein to match the characteristic impedance of the transmission line using uniform memory dies. Instead of a single on-die termination resistance circuit on a last memory die connected in series to the transmission path, electrical termination circuits of multiple uniform memory dies may be connected to act in parallel during the operation to enable higher bandwidth, signal transmission frequency, and/or numbers of memory dies in a stack of memory dies. Solutions disclosed herein may reduce the parasitic capacitance contributed by each memory die and wire bond by using only uniform memory dies each including an on-die termination resistance circuit that has a termination resistance at, or higher than, a minimum termination resistance.

"Electrical termination" refers to the practice of ending a transmission line with a device that matches the characteristic impedance of the line. This is intended to prevent signals from reflecting at the end of the transmission line. Reflections at the ends of unterminated transmission lines cause distortion which can produce ambiguous digital signal levels and mis-operation of digital systems. (Search "electrical termination" on Wikipedia.com Jul. 23, 2018. Modified. Accessed Jun. 5, 2020.)

There are two types of electrical termination, passive or resistive termination and active termination. Passive electrical termination is a circuit that includes a passive electrical component such as a resistor or a set of resistors connected in parallel. Active electrical termination is a circuit that includes an active electrical component such as a transistor or a set of transistors configured to perform electrical termination for an input signal.

The disclosed solutions allow connection of a high number of uniform memory dies and/or operation at a high frequency, which may permit higher bandwidth signaling. One benefit of the disclosed solution(s) is that they use uniform memory dies across the whole transmission path. This prevents the need to install a specially designed memory die or electronic component at a specific location within a memory die stack, simplifying manufacturing and assembly. Further, the on-die termination resistance circuit may be configured such that it is physically impossible for the on-die termination resistance circuit to provide less than the minimum termination resistance. This may reduce the amount of parasitic capacitance that each uniform memory die and wire bond contributes to the transmission path.

In one embodiment, the on-die termination resistance circuit disclosed herein may be constantly connected to the transmission line, even when the uniform memory die is off. In this off state, the uniform memory die may not be powered on, or enabled, and/or the on-die termination resistance circuit may not be enabled, but a minimum resistance may still be provided. The on-die termination resistance circuit disclosed may further be connectable to the transmission line through a switch when the uniform memory die is powered on/enabled and/or the on-die termination resistance circuit is enabled.

In certain embodiments, two or more on-die termination resistance circuits of uniform memory dies of a transmission path may be activated and/enabled during operations with another uniform memory die, the target uniform memory die. These two or more on-die termination resistance circuits of uniform memory dies of the transmission path may include the last two or more uniform memory dies along the transmission path. In this manner the electrical termination may be distributed along the transmission path. Distribution of the end-die electrical termination allows enabled on-die termination resistance circuits to act in parallel. When resistors of a certain value are connected in parallel, they may effectively act as a single resistor having a value of the total resistance of all connected resistors divided by the number of resistors. For example, connecting four 200Ω resistors in parallel yields an effective resistance of 50Ω. In order to implement a single 50Ω resistor on one memory die designed for the end-die slot, the physical configuration used to form that resistance may incur more parasitic capacitance than may be incurred by the four 200Ω resistors distributed across four end-dies.

In addition, the disclosed configuration for termination resistance may be embodied by a higher resistance than a minimum termination resistance. For example, each uniform memory die may be configured to exhibit a termination resistance of 200Ω, while being physically or otherwise limited to a minimum termination resistance of 100Ω. In this manner, the termination resistance on a particular die may be prevented from dropping down to a level which would upset the balance of the distributed on-die termination resistance circuitry and cause more electrical strain on a single die.

"Transmission line" or "Electrical transmission line" refers to a specialized cable or other structure designed to conduct alternating current, or oscillating signal or voltage at a radio frequency (about 20 kHz-300 GHz), or higher. The frequency of the signal is high enough that a wave nature of the signal must be taken into account. Transmission lines are used for purposes such as connecting radio transmitters and receivers with their antennas (they are then called feed lines or feeders), distributing cable television signals, trunk lines routing calls between telephone switching centers, computer network connections and high speed computer data buses. (Search "transmission line" and "radio frequency" on Wikipedia.com May 28, 2020. Modified. Accessed Jun. 4, 2020.)

"Termination resistance" refers to a level, value, or quantity of electrical resistance and/or electrical impedance that a device, apparatus, circuit, sub-circuit provides to provide electrical termination when coupled or connected to a transmission line and/or transmission path carrying an electrical signal. A termination resistance is a result of electrical termination and is measured in units of Ohms. Typically, it is desirable to provide a termination resistance that matches an impedance of a transmission line and/or transmission path.

In some embodiments, the plurality of uniform memory dies is configured to have an effective termination resistance. "Effective termination resistance" refers to a termination resistance representative of a level or quantity of termination resistance, resistance, and/or impedance for a whole transmission path. The effective termination resistance may be different from a termination resistance for any one electronic component or circuit or logic independently within the transmission path and the effective termination resistance may account for aspects of signal transmissions along the transmission path in either or both directions (sender to receiver, receiver to sender).

In some embodiments, a signal on the transmission path carries a host read command, a clock signal, and/or a data signal. "Data signal" refers to an electrical signal (wired or wireless) sent from one component, circuit, driver, device, manager, or controller to another component, circuit, driver, device, manager, or controller. In particular, a data signal is a signal configured to represent a data value. A data signal may be contrasted with a control signal configured to cause another device, component, manager, or controller to act in response to the control signal.

The following embodiments describe systems, apparatuses, devices, circuits, and methods for reducing the effective impedance of a transmission path and/or to match the characteristic impedance of a transmission line or other electronic components of the transmission path using uniform memory dies. A plurality of electrical termination circuits of multiple uniform memory dies may be connected to act in parallel during the operation to distribute the electrical termination near and at an end of the transmission path, while operations are conducted with another uniform memory die along the transmission path. Managing the characteristic impedance, effective termination resistance, and on-die termination resistance along the transmission path may provide for more efficient signal communication and/or improved signal quality, including increased bandwidth, frequency, and/or transmission rate, higher signal-to-noise ratio, reduced jitter, and/or lower duty cycle distortion. Before turning to these and other embodiments, the following paragraphs provide a discussion of exemplary memory systems and storage modules that can be used with these embodiments. These are just examples, and other suitable types of systems, apparatuses, devices, or circuits, including other types of memory systems and/or storage modules, can be used.

FIG. 1A is a block diagram illustrating a memory system 100, such as a memory system. The memory system 100 may include a storage controller 102 and memory that may be made up of a plurality of memory dies 104. "Memory die" refers to a small block of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die. (Search 'die (integrated circuit)' on Wikipedia.com Oct. 9, 2019. Accessed Nov. 18, 2019.) A memory die is a die, in one embodiment, that includes a functional circuit for operating as a memory media and/or a memory array. The memory media and/or memory array may comprise one or more of non-volatile memory media and volatile memory media.

In addition, the term die, in general, may refer to circuitry or circuit components on a single semiconductor substrate, but may or may not include memory cells to store data. The storage controller 102 may interface with a host system and transmit command sequences for read, program, and erase operations to the memory dies 104. Herein, the storage controller 102 is referred to as a storage controller die 102 to identify, or highlight, that the circuitry of the storage controller 102, in certain embodiments, is configured, or located on, a die separate from the plurality of memory dies 104. The storage controller die 102 and each of the memory dies 104 may be configured or function as transceiver circuits, in that they each can transmit and receive signals. As described in further detail below, the storage controller die 102 and the plurality of memory dies 104 are configured to communicate with each other over a plurality of transmission lines.

The storage controller die 102 can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The storage controller die 102 can be configured with hardware and/or firmware to perform the various functions described below. Also, some of the components shown as being internal to the storage controller die 102 can also be stored external to the storage controller die 102, and other components can be used. Additionally, the phrase "operatively in communication with" could mean directly in communication with or indirectly (wired or wireless) in communication with through one or more components, which may or may not be shown or described herein.

The storage controller die 102 is configured to manage data stored in memory cells of the memory dies 104 and also to communicate with a host, such as a computer or electronic device. The storage controller die 102 can have various functionality in addition to the specific functionality described herein. For example, the storage controller die 102 can format the memory cells and/or the circuitry of the memory dies 104 to ensure the memory dies 104 operate properly, map out bad or defective memory cells, and allocate spare cells to be substituted for future failed cells. Some part of the spare cells can be used to hold firmware to operate the storage controller die 102 and implement other features. In operation, when a host needs to read data from or write data to the memory die 104, the host communicates with the storage controller die 102. If the host provides a logical address to which data is to be read/written, the storage controller die 102 can convert the logical address received from the host to a physical address in the memory dies 104. (Alternatively, the host can provide the physical address). The storage controller die 102 may also be configured to perform various memory management functions, such as, but not limited to, wear leveling (distributing writes to avoid wearing out specific blocks of memory that would otherwise be repeatedly written to) and garbage collection (after a block is full, moving the valid pages of data to a new block, so the full block can be erased and reused).

The interface between the storage controller die 102 and the memory dies 104 may be any suitable memory interface, such as Toggle Mode 200, 400, or 800. In one embodiment, the memory system 100 may be a card based system, such as a secure digital (SD) or a micro secure digital (micro-SD) card. In an alternate embodiment, the system 100 may be part of an embedded memory system.

FIG. 1B illustrates a storage module 200 that includes a plurality of memory systems 100. As such, the storage module 200 may include a storage controller 202 that interfaces with a host and with a storage system 204, which includes a plurality of memory systems 100. "Storage controller" refers to any hardware, device, component, element, or circuit configured to manage data operations on memory media (non-volatile and/or volatile), and may comprise one or more processors, programmable processors (e.g., FPGAs), ASICs, micro-controllers, or the like. In some embodiments, the storage controller is configured to store data on and/or read data from memory media (non-volatile and/or volatile), to transfer data to/from the memory device(s) (non-volatile and/or volatile), and so on.

The interface between the storage controller 202 and memory systems 100 may be a bus interface, such as a serial advanced technology attachment (SATA), a serial attached SCSI (SAS), a peripheral component interface express (PCIe) interface, an embedded MultiMediaCard (eMMC) interface, a SD interface, or a Universal Serial Bus (USB) interface, as non-limiting examples. The storage module 200, in one embodiment, may be a solid state drive (SSD), such as found in portable computing devices, such as laptop computers and tablet computers, and mobile phones.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a SAS interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

FIG. 2A is a block diagram illustrating exemplary components of the storage controller die 102 in more detail. The storage controller die 102 may include a front end module 108 that interfaces with a host, a back end module 110 that interfaces with the memory dies 104, and various other modules that perform various functions of the memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The storage controller die 102 may include a buffer manager/bus controller module 114 that manages buffers in random access memory (RAM) 116 and controls the internal bus arbitration for communication on an internal communications bus 117 of the storage controller die 102. A read only memory (ROM) 118 may store and/or access system boot code. Although illustrated in FIG. 2A as located separately from the storage controller die 102, in other embodiments one or both of the RAM 116 and the ROM 118 may be located within the storage controller die 102. In yet other embodiments, portions of RAM 116 and ROM 118 may be located both within the storage controller die 102 and outside the storage controller die 102. Further, in some implementations, the storage controller die 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Examples types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction controller (ECC) engine 124 that encodes the data bytes received from the host and decodes and error corrects the data bytes read from the memory dies 104. Additionally, the back end module 110 may include a RAID (Redundant Array of Independent Drives) module 126 that manages generation of RAID parity and recovery of failed data. The RAID parity may be used as an additional level of integrity protection for the data being written into the memory system 100. In some cases, the RAID module 126 may be a part of the ECC engine 124.

In addition, the back end module 110 may include a command sequencer 128 and a memory interface 130. The command sequencer may be configured to generate command sequences, such as program, read, and erase command sequences, to be transmitted to the memory dies 104. The commands of the command sequences that the command sequencer 128 outputs may be referred to as context commands. For example, commands of command sequences for read operations may be referred to as read context commands, and commands of command sequences for write operations may be referred to as write context commands.

The memory interface 130 is configured to output the command sequences or context commands to the memory dies 104 and receives status information from the memory dies 104. Along with the command sequences and status information, the memory interface 130 may also be configured to send and receive data, such as in the form of data signals, to be programmed into and read from the memory dies 104. The memory interface 130 may also be configured to output clock signals or strobe signals to control the timing at which the memory dies 104 receive data signals carrying data to be programmed and/or at which the memory dies 104 output data signals carrying data the storage controller die 102 wants read from the memory dies 104. The memory interface 130 may have any of various configurations to send and receive signals. Example circuit components include input/output (I/O) driver circuitry (e.g., push-pull circuits, amplifiers, buffers, Schmitt trigger circuits, on-die termination resistance circuits, etc.) to generate and receive the signals, and I/O contact pads that communicate signals between transmission lines 134 and the I/O driver circuitry. In one embodiment, the memory interface 130 may be a double data rate (DDR) interface, such as a Toggle Mode 200, 400, or 800 interface. In some example configurations, the storage controller die 102 may include a control layer 132 (e.g., a flash controller layer) that controls the overall operation of back end module 110.

As shown in FIG. 2A, the memory system 100 may include a plurality of transmission (Tx) lines 134 connecting the storage controller die 102 and the plurality of memory dies 104. In general, a transmission line is any conductive structure or combination of conductive structures configured to conduct alternating current (AC) or radio frequency (RF) signals from a transmitter that is transmitting the signals to a receiver that is receiving the signals. For the example memory systems described herein, transmission lines are included to communicate signals between (including to and from) the storage controller die 102 and the memory dies 104. The storage controller die 102 and the memory dies 104 may be configured to communicate signals, including data signals, clock signals, command signals, over the plurality of transmission (Tx) lines 134. A signal that is communicated between the storage controller die 102 and the memory dies 104 may be either transmitted from the storage controller die 102 over one of the transmission lines 134 to the memory dies 104, or transmitted from the memory dies 104 over one of the transmission lines 134 to the storage controller die 102. In this context, the storage controller die 102 and each of the memory dies 104 may be configured as transceiver circuits (or dies) in that they may each be configured to transmit and receive signals. Additionally, the transmission lines 134 may be coupled to the transmission lines 134 via its memory interface 130. That is, when the storage controller die 102 wants to send a signal to the memory dies 104, the storage controller die 102 may send the signal through its memory interface 130 onto one of the transmission lines 134. The memory dies 104 may each have their own respective memory interfaces to send and receive signals, as described in further detail below with respect to FIG. 3. When referring to the memory interfaces, the memory interface of the storage controller die 102 may be referred to as a controller-side memory interface 130, and the memory interfaces of the memory dies 104 may be referred to as memory-side memory interfaces.

Additional modules of the memory system 100 illustrated in FIG. 2A may include a media management layer 138, which may perform certain memory functions, such as address management (e.g., address translation) and wear leveling of memory cells of the memory dies 104. The memory system 100 may also include other discrete components 140, such as external electrical interfaces, external RAM, resistors, capacitors, or other components that may interface with the storage controller die 102. In alternative embodiments, one or more of the RAID module 126, media management layer 138 and buffer management/bus controller module 114 are optional components that may not be included in the storage controller die 102.

Figure 2B:
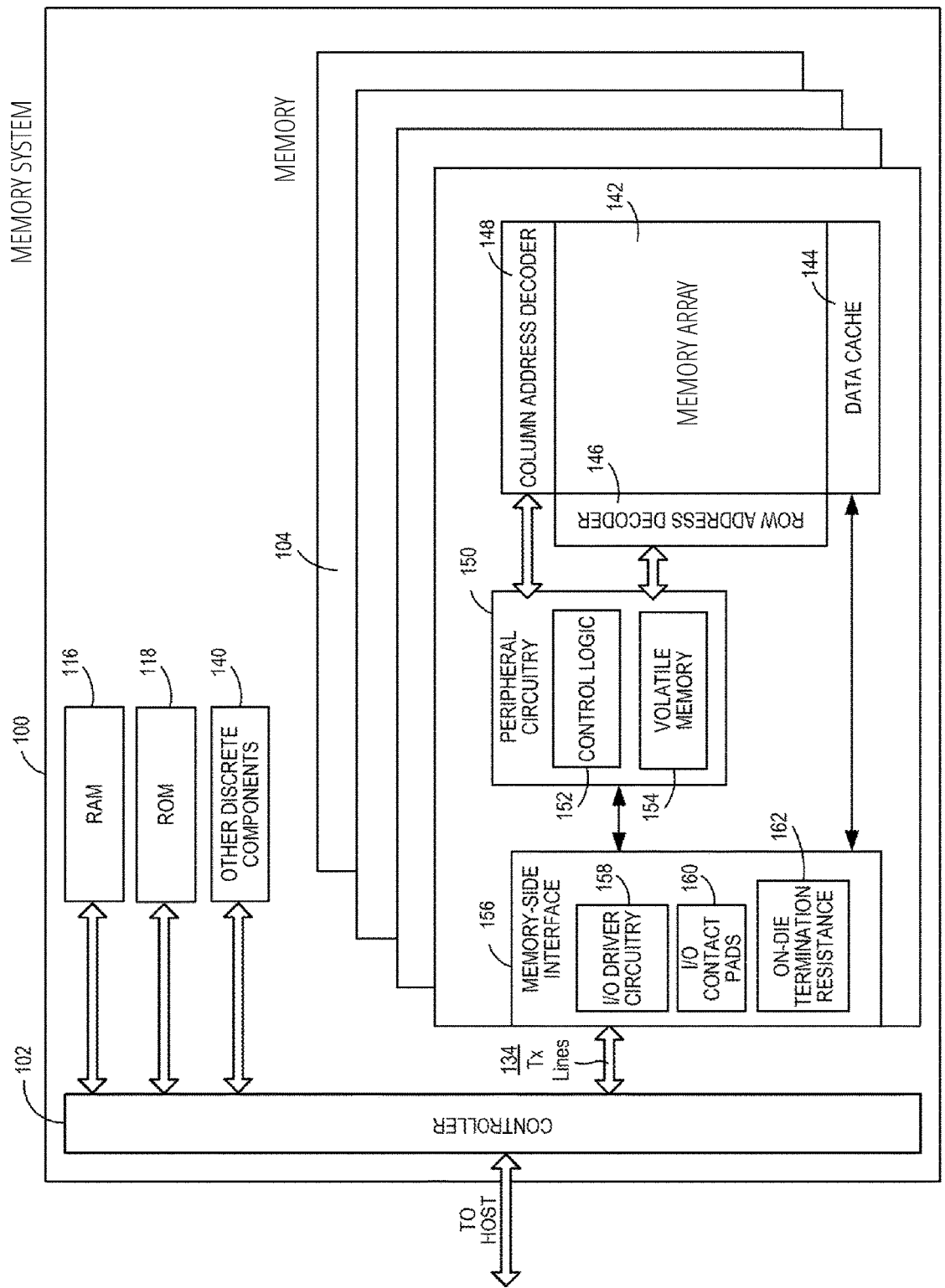
FIG. 2B is a block diagram of example components of a memory die of an example memory system.

FIG. 2B is a block diagram illustrating exemplary components of one of the memory dies 104 in more detail. The memory die 104 may include a memory cell structure 142. In some example configurations, the memory cell structure 142 may be configured in the form of an array, such as two-dimensional or a three-dimensional array.

Any suitable type of memory can be used for the memory cells. As examples, the memory can be volatile memory, such as dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor or other material capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure (e.g., an array).

In a two dimensional memory structure, the semiconductor memory elements are arranged in a single plane or a single memory device level. Typically, in a two dimensional memory structure, memory elements are arranged in a plane (e.g., in an x-z direction plane) which extends parallel to a major surface of a substrate that supports the memory elements. The substrate may be a wafer over or in which the layer of the memory elements is formed, or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Additional way of organizing the memory cells of the memory cell structure 142 may be possible. As a non-limiting example, the memory cells may be organized into blocks, and the blocks may be organized into planes. Additionally, the memory cells of the memory cell structure may be connected to biasing lines, including word lines and bit lines. Circuitry on the memory die may be configured to bias the word lines and bit lines with various voltages in order to perform memory operations associated with the memory cells, including read, program, and erase operations.

The memory die 104 may further include a page buffer or data cache 144 that caches data that is sensed from and/or that is to be programmed to the memory cell structure 142. The memory die 104 may also include a row address decoder 146 and a column address decoder 148. The row address decoder 146 may decode a row address and select a particular word line in the memory cell structure 142 when reading or writing data to/from the memory cells in the memory cell structure 142. The column address decoder 148 may decode a column address to select a particular group of bit lines in the memory cell structure 142 to be electrically coupled to the data cache 144.

In addition, the memory die 104 may include peripheral circuitry 150. The peripheral circuitry 150 may include control logic circuitry (otherwise referred to as an on-chip controller, die controller, or simply controller) 152, which may be implemented as a state machine, that provides on-chip control of memory operations as well as provide status information to the storage controller 102. "Die controller" refers to a set of circuits, circuitry, logic, or components configured to manage the operation of a die. In one embodiment, the die controller is an integrated circuit. In another embodiment, the die controller is a combination of discrete components. In another embodiment, the die controller is a combination of one or more integrated circuits and one or more discrete components. The peripheral circuitry 150 may also include volatile memory 154. An example configuration of the volatile memory 154 may include latches, although other configurations are possible.

Also, the memory die 104 may include a memory-side interface 156 that is configured to interface and communicate with the memory interface 130 of the storage controller die 102. In particular, the memory-side interface 156 may be configured to couple with at least some of the transmission lines 134 of the memory system 100. When a given memory die 104 is to transmit a signal to the storage controller die 102, the given memory die 104 may transmit the signal via its memory-side interface 156 onto one of the transmission lines 134 to the storage controller die 102. Additionally, when a given memory die 104 is to receive a signal from the storage controller die 102, the given memory die 104 may receive the signal via its memory-side interface 156 from one of the transmission lines 134. As described in further detail below, components of the memory-side interface 156, along with die capacitance of the dies may form part of and/or determine characteristics impedances of the transmission lines 134.

The memory-side interface 156 may include input/output (I/O) driver circuitry 158 that is configured to generate and receive signals, including data signals carrying data, command signals identifying commands, clock signals, or other types of signals carrying other information to be transmitted to and received from the storage controller die 102. For example, data sensed into the data cache 144 may be sent to the I/O driver circuitry 158 for transmission to the storage controller die 102. Similarly, data received from the storage controller die 102 may be received by the I/O driver circuitry 158, and the I/O driver circuitry 158 may communicate the data to the data cache 144. Additionally, commands to be communicated between the storage controller die 102 and the control logic 152 may be communicated via the I/O driver circuitry 158. The I/O driver circuitry 158 may have any of various circuit or combinations of circuits, examples of which include push-pull circuits, amplifiers, buffers, Schmitt-trigger circuits, combinations thereof, or any other suitable circuit configured to receive a signal from a transmission line or output a signal into a transmission line.

Additionally, the memory-side interface 156 may include input/output (I/O) contact pad portions 160 in communication with the I/O driver circuitry 158 that is configured to send signals to and receive signals from the I/O driver circuitry 158. For example, the signals that the I/O circuitry 158 generates for transmission to the storage controller die 102 may be communicated from the I/O driver circuitry 158 to the I/O contact pads 160. Similarly, the signals that the memory-side interface 156 receives from the storage controller die 102 may be sent from the I/O contact pads 160 to the I/O driver circuitry 158. In addition, as described in further detail below, the I/O contact pads 160, along with wire bond elements (WBE) (shown in FIG. 3) may form or be part of the transmission lines 134 over which the memory dies 104 and the storage controller die 102 communicate signals between each other. "Wire bond" refers to a wire, often made of aluminum, alloyed aluminum, copper, silver, gold or doped gold, for interconnection of integrated circuits, communication buses and/or communication channels.

Also, as shown in FIG. 2B, the memory-side interface 156 may include on-die termination resistance circuit (ODT) 162, which may include one or more resistors or other circuit components (e.g., electronic components) providing a termination resistance. The on-die termination resistance circuit 162 may provide termination resistance or impedance for the transmission lines 134 and may be used for impedance matching between the memory dies 104 and the characteristic impedances of the transmission lines 134. "On-die termination resistance circuit" refers to any circuit, sub-circuit, electronic component, hardware, software, firmware, module, logic, device, or apparatus configured, programmed, designed, arranged, or engineered to provide electrical termination for a signal on a transmission line or transmission path. In one embodiment, a storage controller also may include an on-die termination resistance circuit.

Resistors of the on-die termination resistance circuit 162 may be connected to the I/O contact pads 160. In addition, the on-die termination resistance circuit 162 may provide variable resistance levels or values, including one or more high levels and one or more low levels, as described in further detail below. The resistance levels or values that the on-die termination resistances provide may be controlled by the storage controller die 102, the on-die control logic 152, or a combination thereof.

The memory dies 104 implemented in the illustrated architecture(s) may be uniform memory dies. "Uniform memory die" refers to a memory die that includes the same or substantially the same parts, components, electronic components, circuits, features, size, configuration, and/or capabilities as another memory die. Using uniform memory dies within a die stack may simplify the manufacturing and assembly of a storage system.

Figure 3:
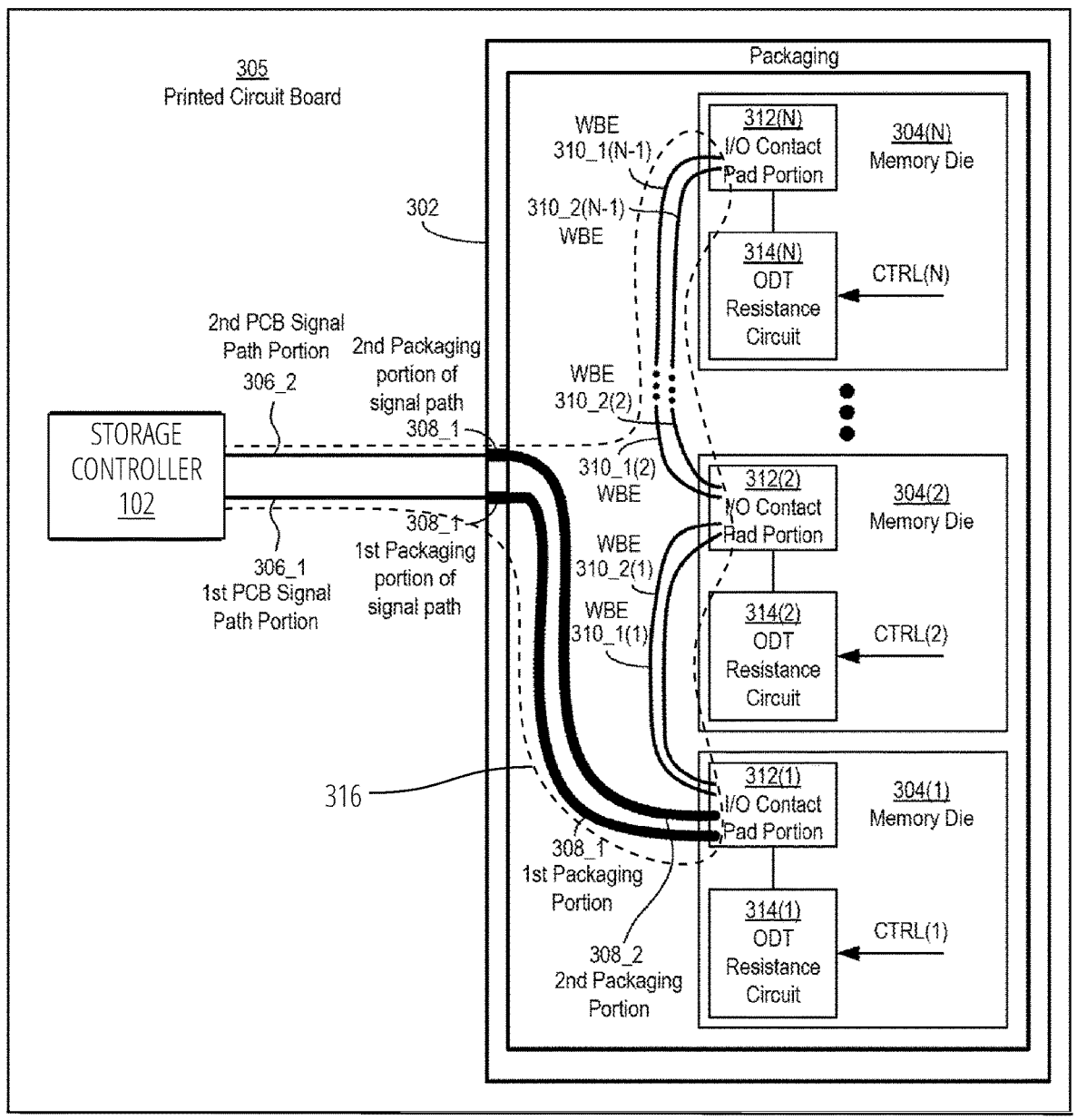
FIG. 3 is a block diagram of a structural layout of the storage controller and an N-number of uniform memory dies.

FIG. 3 shows a block diagram of a structural layout of the storage controller die 102 and an N-number of the plurality of uniform memory dies 304, including a first uniform memory die 304(1), a second uniform memory die 304(2), and an Nth uniform memory die 304(N). N may be any integer of two or more. The N-number of uniform memory dies 304(1)-304(N) may include all of the memory dies 104 in the memory system 100 or may be less than all of the memory dies 104. For example, the N-number of uniform memory dies 304(1)-304(N) may be located on the same chip and/or may be part of the same chip enable group. The memory system 100 may include a single chip or chip enable group in which the memory dies 104 are located. The N-number of dies 304 of FIG. 3 may be representative of that single chip or chip enable group of dies. Alternatively, the memory system 100 or may include multiple chips or chip enable groups, and some of the memory dies 104 may be located on one chip or in one chip enable group, while other memory dies 104 may be located on one or more other chips or in one or more other chip enable groups. The N-number of dies 304 of FIG. 3 may be representative of one of the plurality of chips or chip enable groups. In addition, or alternatively, the N-number of dies 304 may be configured as or part of the same die stack. Various configurations are possible. Further details of dies configured as a die stack is described in further detail below with reference to FIG. 3.

In the example configuration shown in FIG. 3, the uniform memory dies 304(1)-304(N) may be configured in and/or integrated with a packaging 302, which may include various packaging components such as a die substrate, traces and vias integrated in the die substrate, solder balls, contact pads, wire bonds, and a cover, as non-limiting examples. The storage controller die 102 may be configured and/or implemented as its own chip and/or integrated with its own packaging separate to that of the uniform memory dies 304(1)-304(N). The storage controller die 102 and the uniform memory dies 304(1)-304(N) integrated with the packaging 302 may be integrated on a printed circuit board 305, as shown in FIG. 3.

The storage controller die 102 and the uniform memory dies 304(1)-304(N) may communicate signals between each other on transmission lines (e.g., at least some of the transmission lines 134 of FIG. 2A and FIG. 2B) connecting the storage controller die 102 and the uniform memory dies 304(1)-304(N). For simplicity, the physical layout of FIG. 3 shows a single transmission line connecting the storage controller die 102 and the uniform memory dies 304(1)-304(N). However, in actual implementation as described with reference to FIG. 2A and FIG. 2B, there may be multiple transmission lines between the storage controller 102 and the uniform memory dies 304(1)-304(N) configured to communicate data signals, clock signals, strobe signals, command signals, status signals, or any other type of signals between the storage controller die 102 and the uniform memory dies 304. For example, there may be a first transmission line over which the storage controller die 102 sends signals to the uniform memory dies 304, and a second transmission line over which the uniform memory dies 304 send signals to the storage controller die 102. In addition, at least some of the multiple transmission lines may be configured to be in parallel with each other such that two or more signals propagating on two or more parallel transmission lines may be communicated separately and/or simultaneously. As mentioned, each transmission line may be configured to carry one of more signals, with each signal being a data signal, a command signal, a clock signal, or any other type of signal that may be communicated between the storage controller 102 and the uniform memory dies 304(1)-304(N), including those for performance of memory operations.

In some example configurations, the transmission line may be configured as a single-ended transmission line or signal path configured to communicate a single-ended signal. For other example configurations, the transmission line may be configured as a differential transmission line or signal path configured to communicate a differential signal. "Signal path" refers to a conductive path that an electromagnetic wave or signal travels in response to a driving force. In certain embodiments, a signal path may comprise a transmission line. In another embodiment, a signal path may comprise a transmission path. In one embodiment, a transmission path may include one or more of a transmission line and/or a signal path.

For either of the configurations, the transmission line may include a first conductive path and a second conductive path. As described in further detail below, the transmission line and/or its first and second conductive paths, may include any of various types of conductive elements, such as traces, vias, solder balls, contact pads, wire bonds, as non-limiting examples, to communicate a signal between the storage controller 102 and the uniform memory dies 304.

For single-ended configurations, the first path may be a signal path component or portion (or just signal path) of the transmission line, and the second path may be a ground reference or return component or portion (or just ground path or return path) of the transmission line. A single-ended signal communicated along the signal path may be a single signal or have a single signal component (e.g., a voltage or current data transitions including a clock signal oscillating at a certain frequency) that propagates along the signal path with reference to the ground reference path.

For differential configurations, both the first path and the second path may be signal paths, each configured to communicate a respective signal component of the differential signal. That is, the differential signal communicated on the differential signal path may include a first signal component (or just first signal) and a second signal component (or just second signal). As a differential signal, the first signal component and the second signal component may have amplitudes that are inversely related or are inverses of each other, and in some cases, have amplitudes that are equal in magnitude and opposite in polarity, at any of various moments in time during signal propagation along the differential signal path. The first signal component of the differential signal may propagate along a first signal path of the differential signal path, and the second signal component of the differential signal may propagate along a second signal path of the differential signal path.

In general, in the example configuration shown in FIG. 3, the transmission line, whether it be for a single-ended configuration or a differential configuration, may include a printed circuit board (PCB) portion 306, a packaging portion 308, a wire bond element 310, and an input/output (I/O) contact pad portion 312. The portions or components of the first path of the transmission line are referred to as first portions or components, and the portions or components of the second path of the transmission line are referred to as second portions or components. In addition, the transmission line and/or the first and second paths may further include or be coupled to a termination resistance of the storage controller 102 (not shown in FIG. 3) and an on-die termination (ODT) resistance circuit 314 of the uniform memory dies 304. Other transmission line configurations may include fewer, additional, or other portions compared to the portions shown in FIG. 3.

In further detail, the first path may include a first PCB portion 306_1 and the second path may include a second PCB portion 306_2. Each of the first and second PCB portions 306_1, 306_2 may be integrated with the printed circuit board 305 and extend between the storage controller 102 and the packaging 302. In addition, the first and second PCB portions 306_1, 306_2 may each be implemented as a conductive trace (such as in the form of a microstrip or a stripline, for example), one or more vias, a combination of traces and vias, or any other type of conductive element configured to carry a signal over the printed circuit board 305 from the storage controller die 102 to the packaging 302.

In addition, the first path may include a first packaging portion 308_1, and the second path may include a second packaging portion 308_2. The first and second PCB portions 306_1, 306_2 may be connected to their respective first and second packaging portions 308_1, 308_2. In general, the packaging portions 308_1, 308_2 may be configured to communicate signals on the transmission line from the PCB portion 306 to the uniform memory dies 304. The first and second packaging portions 308_1, 308_2 may each include any of various conductive elements to do so, examples of which include solder balls, such as those of a ball grid array structure, vias and/or traces integrated in a die substrate, contact pads, and wire bonds. Various configurations for connecting the PCB portion 308 of the transmission line with the I/O contact pads of the uniform memory dies 304 are possible.

Additionally, the first path may include a first set of wire bond elements (WBE) 310_1, and the second path may include a second set of wire bond elements 310_2. Each wire bond element 310 may include a wire bond. Also, as described in further detail below, in some example configurations, at least one wire bond element 310_1 of the first path and/or at least one wire bond element 310_2 of the second path may include an additional conductive structure, referred to as an inductance-adding element, that adds an amount of inductance to an amount of inductance that the wire bond of the wire bond element provides. Types of additional conductive structures are described in further detail below.

In the example configuration shown in FIG. 3, the I/O contact pad portions 312 include an N-number of I/O contact pad portions 312(1) to 312(N). Each contact pad portion 312 may include at least two contact pads, including a first contact pad that is part of the first path and a second contact pad that is part of the second path. For clarity, the two different or separate contact pads of a given I/O contact pad portion 312 are not shown in FIG. 3. Also, for configurations where the transmission line is configured to transmit signals from the storage controller die 102 to the uniform memory dies 304, the contact pads that are part of the transmission line are referred to as input contact pads. In addition, for configurations where the transmission line is configured to transmit signals from the uniform memory dies 304 to the storage controller die 102, the contact pads that are part of the transmission line are referred to as output contact pads.

In addition, each wire bond element 310 may be configured to connect a contact pad on one uniform memory die 304 with a contact pad of another, different uniform memory die 304. For example, a first wire bond element 310_1(1) of the first path may connect a contact pad of a first I/O contact pad portion 312(1) of the first uniform memory die 304(1) with a contact pad of a second I/O contact pad portion 312(2) of the second uniform memory die 304(2). Similarly, an (N−1)th wire bond element 310_2(N−1) of the second path may connect a contact pad of a (N−1)th I/O contact pad portion 312(N−1) of an (N−1)th uniform memory die 304(N−1) (not shown) with a contact pad of a Nth I/O contact pad portion 312(N) of the Nth uniform memory die 304(N).

The wire bond elements 310 and the I/O contact pad portions 312, in combination, may form a part or a portion of the transmission line, with each I/O wire bond element 310 and each I/O contact pad portion 312 having positions relative to each other in the transmission line that correspond to propagation delay or electrical distance from the packaging portion 308. A signal transmitted from the storage controller 102 may take a shorter amount of time to reach a given contact pad or a given wire bond element positioned electrically closer to the packaging portion 308 compared to a given contact pad or a given wire bond element positioned electrically farther from the packaging portion 308.

The uniform memory dies 304, the wire bond elements 310, and the I/O contact pad portions 312 are numbered in FIG. 3 to correspond to their respective positions in the transmission line. Given an index k, the higher the value of k, the further the kth wire bond element WBE(k) and the kth I/O contact pad portion 312(k) are in the transmission line with respect to lower numbered wire bond elements 310 and I/O contact pad portions 312, and/or from the packaging portion 308, the PCB portion 306, and the storage controller 102. The Nth I/O contact pad portion 312(N) may be a memory-side end or termination of the transmission line. Additionally, a contact pad on the storage controller die 102 may be a controller-side end or termination of the transmission line. In this context, the Nth die 304 may be referred to as an end die or a termination die of the plurality of dies 304 since it has the contact pads forming the memory-side termination of the transmission line—i.e., the contact pads electrically positioned on the transmission line farthest from the packaging portion 308, the PCB portion 306, and the storage controller die 102.

Accordingly, in a situation where the storage controller 102 transmits a signal to a kth uniform memory die 304(k), a pulse of the signal will have propagated over a (k−1)-number of I/O contact pad portions 312 and a (k−1)-number of wire bond elements 310 before reaching the kth I/O contact pad portion 312(k). Similarly, when a kth uniform memory die 304(k) transmits a signal to the storage controller 102, upon a pulse of the signal being output at the kth I/O contact pad portion 312(k), the pulse will propagate over a (k−1)-number of wire bond elements 310 and a (k−1) number of I/O contract pad portions 312 before reaching the packaging portion 308. Additionally, upon being output at the kth I/O contact pad portion 312(k), the pulse may also propagate over an (N−k)-number of wire bond elements 310 and an (N−k)-number of I/O contact pad portions 312.

In addition, the N-number of uniform memory dies 304(1)-304(N) may be part of the same chip group. The uniform memory dies 304(1)-304(N) may be part of the same chip group by being located within the same packaging 302, having their respective I/O contact pad portions 312(1)-312(N) electrically connected to the same packaging portion 308 and/or the same PCB portion 306 between the storage controller die 102 and the packaging 302, being identified by the storage controller die 102 as being part of the same chip group, or some combination thereof.

The N-number of uniform memory dies 304 may be configured in any of various ways within the memory system. In one example configuration, the N-number of dies 304 may be configured as a die stack, and in particular as a staircase stack. In general, a given die may be a generally planar structure having two opposing planar surfaces, including a first planar surface and a second planar surface. In a die stack, the dies may be disposed on or "stacked" on top of one another, starting with a first or base die and extending in a direction perpendicular to planar surfaces of the dies. As a die stack, one planar surface of one die may face and/or contact a planar surface of a second die. Also, two dies are adjacent to each other where no other dies of the stack are disposed in between them. Also, in some example configurations, a first or base die may be disposed or mounted on a base substrate or a printed circuit board directly. A last or Nth die of the stack may be the die that is disposed further from the base substrate or printed circuit board on which the die stack is mounted. Also, for embodiments where the die stack is configured as a staircase stack, the dies may be stacked on top of one another such that the dies do not completely cover each other, and instead such that each die has an exposed portion where respective I/O contact pad portions may be disposed and connected with each other via wire bonds. By disposing on the dies on top of one another to create exposed portions, the dies of the die stack, when viewed from the side, have a "staircase" shape, which each die being one of the "steps" of the staircase.

A dashed line is used to delineate an entire transmission path 316, including transmission lines incorporated within the printed circuit board 305, as well as wire bond connections between the uniform memory dies 304. "Transmission path" refers to an electrical signal that an electronic signal travels through a circuit or a portion of a circuit. A transmission path may include a variety of electrical components and may include one or more connections to a ground source, a signal source, and/or a power source. In certain embodiments, a transmission path may include a transmitter, a receiver, and one or more transmission lines. A transmission path may also be referred to as a 'main line.'

Impedance components such as characteristic impedance, resistances, parasitic capacitance, and inductances may be incurred along the length of the transmission path 316. If not properly terminated, these effects may introduce reflections and noise due to transmission line effects, negatively impacting signal speed and bandwidth.

Figure 4:
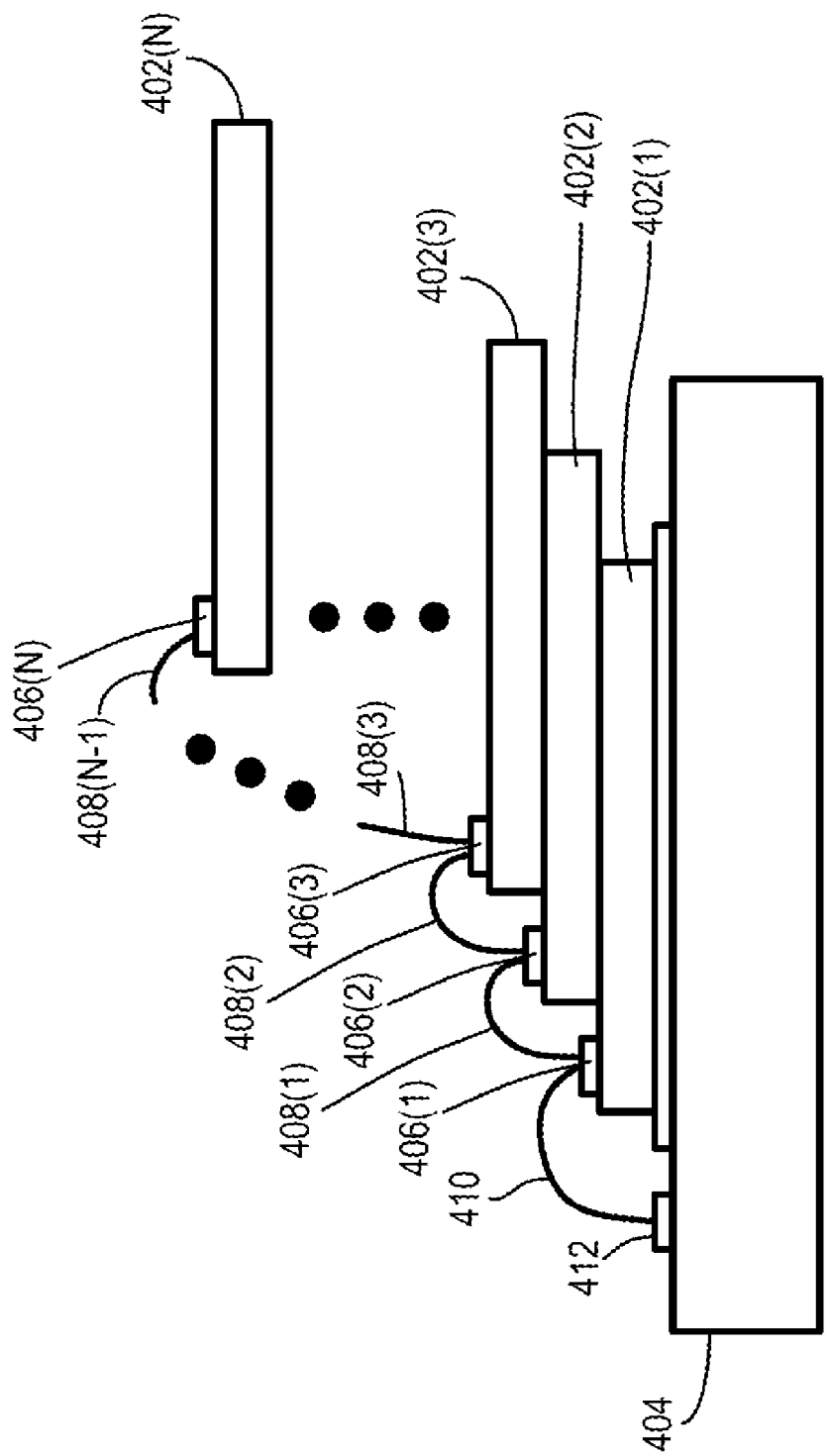
FIG. 4 is cross-sectional side view of a plurality of uniform memory dies integrated as a stack of uniform memory dies.

FIG. 4 shows a cross-sectional side view of a plurality of memory dies 402(1)-402(N) integrated or configured as a staircase stack. The plurality of memory dies 402(1)-402(N) may be representative of the plurality of uniform memory dies 304(1)-304(N), and illustrate an example configuration in which the plurality of uniform memory dies 304(1)-304(N) may be integrated with each other and the packaging 302.

In the example configuration shown in FIG. 4, the stack of dies 402 may be disposed on a die substrate 404. In particular, a first die 402(1) may be in contact with and/or be the closest of the memory dies 402 to the die substrate. In addition, the other memory dies 402(2)-402(N) are stacked on the first memory die 402(1) in a staircase configuration such that the second memory die 402(2) is disposed on the first memory die 402(1), the third memory die 402(3) is disposed on the second memory die 402(2), and the Nth memory die 402(N) is disposed on the (N−1)th memory die 402(N−1) (not shown).

Also, each of the memory dies 402(1)-402(N) may have contact pads of respective I/O contact pad portions. The cross-sectional side view of FIG. 4 shows one of the paths, and accordingly shows contact pads 406 for the single path shown in FIG. 4. For the single path shown, the first memory die 402(1) may include a first contact pad 406(1), the second memory die 402(2) may include a second contact pad 406(2), the third memory die 402(3) may include a third contact pad 406(3), and the Nth memory die 402(N) may include an Nth contact pad 406(N).

The path shown in FIG. 4 may also include an N−1 number of wire bond elements 408. Each ith wire bond element 408(i) may connect an ith contact pad with an (i+1)th contact pad 406(i+1). For example, a first wire bond element 408(1) may connect the first contact pad 406(1) with the second contact pad 406(2), a second wire bond element 408(2) may connect the second contact pad 406(2) with the third contact pad 406(3), a third wire bond element 408(3) may connect the third contact pad 406(3) with a fourth contact pad 406(4) (not shown), and an (N−1)th wire bond element 408(N−1) may connect an (N−1)th contact pad 406(N−1) (not shown) with the Nth contact pad 406(N). Also, for the example configuration of FIG. 4, a wire bond element 410 may connect the first contact pad 406(1) with a contact pad 412 of the die substrate 404.

Referring back to FIG. 3, each of the uniform memory dies 304(1)-304(N) includes a respective on-die termination (ODT) resistance circuit 314 connected to an associated I/O contact pad 312. For example, the first uniform memory die 304(1) includes a first on-die termination resistance circuit 314(1) connected to the first I/O contact pad 312(1), the second uniform memory die 304(2) includes a second on-die termination resistance circuit 314(2) connected to the second I/O contact pad 312(2), and the Nth uniform memory die 304(N) includes an Nth on-die termination resistance circuit 314(N) connected to the Nth I/O contact pad 312(N).

Each of the on-die termination resistance circuits 314(1)-314(N) may have an associated on-die termination resistance. The resistance that a given on-die termination resistance circuit 314 has may be variable. That is, the resistance of a given on-die termination resistance circuit 314 may be at one of a plurality of resistance levels.

The resistance levels that each of the on-die termination resistance circuits 314 may be set to may include at least two levels, including a high resistance level and a low resistance level. In addition, for at least some example configurations, the resistance levels may include a plurality of low levels, and/or a plurality of high levels. Accordingly, at a given moment in time, a given on-die termination resistance circuit 314 may be configured to set its on-die termination resistance to one of a plurality of high resistance levels and/or to set its on-die termination resistance to one of a plurality of low resistance levels.

Additionally, a given on-die termination resistance circuit 314 may be configured to change or adjust its on-die termination resistance from a first resistance level to a second resistance level. The first and second resistance levels may be any of various combinations of high and low resistance levels. That is, depending on the configuration, the given on-die termination resistance circuit 314 may be configured to change its on-die termination resistance from a high resistance level to a low resistance level, from a low resistance level to a high resistance level, from a first high resistance level of a plurality of high resistance levels to a second high resistance level of the plurality of high resistance levels (where the first high resistance level can be either higher or lower than the second high resistance level), or from a first low resistance level of a plurality of low resistance levels to a second low resistance level of the plurality of low resistance levels (where the first low resistance level can be either higher or lower than the second low resistance level).

In certain embodiments, the on-die termination resistance circuit 314 of each uniform memory die is configured such that the low resistance level that the on-die termination resistance circuit 314 can provide is no lower than a minimum termination resistance (e.g., a minimum termination resistance level). Thus, while an on-die termination resistance circuit 314 may be capable of programmatically providing a plurality of low resistance levels, none of these may be lower than the minimum termination resistance. Consequently, the minimum termination resistance is the lowest termination resistance level the on-die termination resistance circuit 314 provides regardless of whether the uniform memory die is powered on, enabled, and activated or whether the on-die termination resistance circuit 314 is powered on, enabled, or activated.

In general, a high resistance level is higher than a low resistance level. In some example configurations, the high resistance level, is greater than or equal to 500 Ohms ($\Omega$) and the low resistance level is lower than or equal to 200$\Omega$. Example high resistance levels may be 500 Ohms, 1 k$\Omega$, or 10 k$\Omega$. Example low resistance levels include 110 Ohms, 125 Ohms, 135 Ohms, 150 Ohms, 175 Ohms, and 200 Ohms. Example minimum termination resistance levels may be 100 ohms, 150 ohms, or 200 ohms. Other high resistance levels may be possible. In addition, or alternatively, the high resistance level may be greater than or equal to ten times a characteristic impedance of the transmission line.

In addition, for some example configurations the high resistance level is a single or fixed value, and the low resistance level can be any one of a plurality of low resistance levels each greater than a minimum termination resistance level at any given moment in time. For such configurations, each of the low resistance levels is lower than the single high resistance level.

Also, in some example configurations, for a given ith die 304($i$) that includes an ith on-die termination resistance circuit 314($i$), at a given point in time, the ith on-die termination resistance circuit 314($i$) may set its resistance level to a high resistance level that is in a range of high resistance levels that includes an upper bound high resistance level and a lower bound high resistance level, and/or may set its resistance level to a low resistance level that is in a range of low resistance levels that includes an upper bound low resistance level and a lower bound low resistance level.

At any given point in time, the ith on-die termination resistance circuit 314($i$) may set its resistance to any one of a plurality of high resistance levels in the range of high resistance levels, and/or may set its resistance level to any one of a plurality of low resistance levels in the range of low resistance levels. In addition, or alternatively, the resistance levels may be discrete values or levels, and the last three or more on-die termination resistance circuits 314($i$) may set their resistance levels to one of the discrete resistance levels.

The resistance level that each of the on-die termination resistance circuits 314(1)-314(N) provides may be determined and/or controlled by the storage controller die 102, the plurality of uniform memory dies 304(1)-304(N) themselves, such as by their control logic 152 (FIG. 3), or a combination thereof. As shown in FIG. 3, each of the on-die termination resistance circuits 314(1)-314(N) may be configured to receive a respective control signal CTRL(1)-CTRL(N) that sets and/or adjusts the resistance level. For some example configurations, the storage controller die 102 may send a command signal to the plurality of uniform memory dies 304 that indicates one or more resistance levels of one or more of the on-die termination circuits 314. In response, the uniform memory dies 304 may set the on-die termination resistance circuits 314 to the resistance levels indicated by the command signal. For example, the on-die control circuits 152 may output respective control signals CTRL to respective on-die termination resistance circuits 314.

In addition, the on-die termination resistance circuits 314 may be part of or coupled to the transmission line. As previously described, the Nth uniform memory die 304(N) may be an end die or a last die of the plurality of uniform memory dies 304 (or of the die stack). In certain embodiments, two or more uniform memory die in the transmission path 316 before the end memory die, and the end memory die may be used to provide distributed on-die termination. Accordingly, the on-die termination resistance circuit 314 (N) of the Nth uniform memory die 304(N) and two or more uniform memory die in the transmission path 316 before the end die may be referred to as distributed on-die termination resistance circuits that together provide electrical termination of the transmission line. Distributed on-die termination uses two or more uniform memory die at the end of the transmission path to distribute the functionality of electrical termination among a plurality of uniform memory dies along the transmission path.

Figure 5:
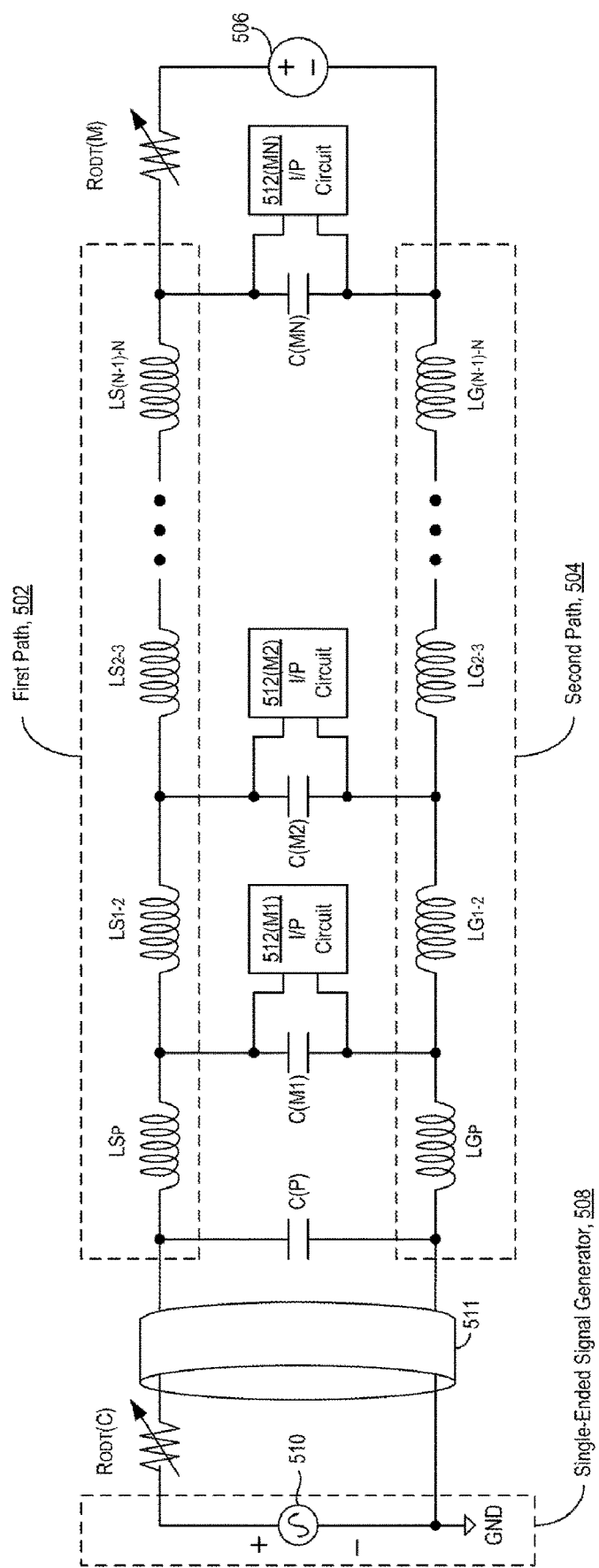
FIG. 5 is a partial circuit schematic of a circuit model of a single-ended transmission line, where a storage controller transmits a single-ended signal to the N-number of uniform memory dies of FIG. 3.
Figure 6:
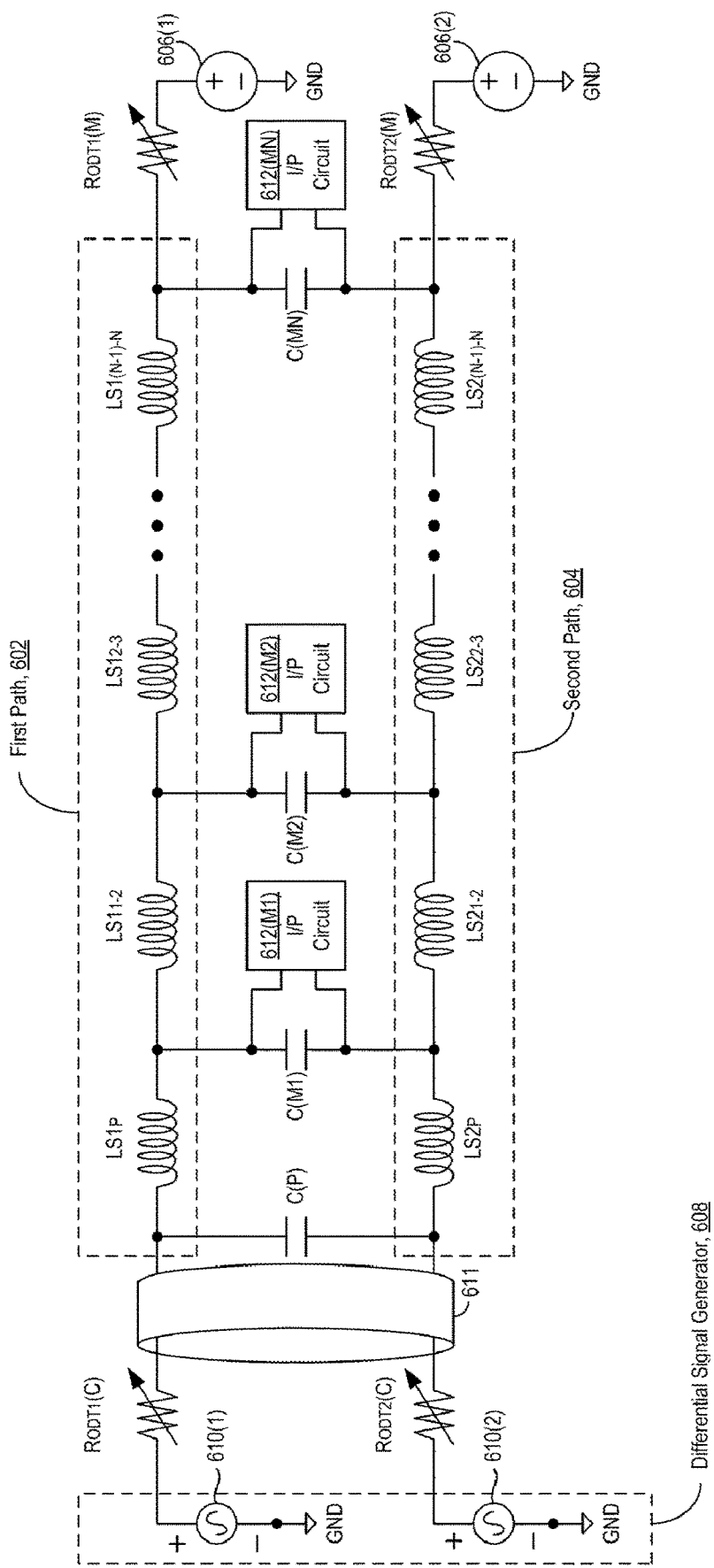
FIG. 6 is a partial circuit schematic of a circuit model of a differential transmission line, where the storage controller transmits a differential signal to the N-number of uniform memory dies of FIG. 3.
Figure 7:
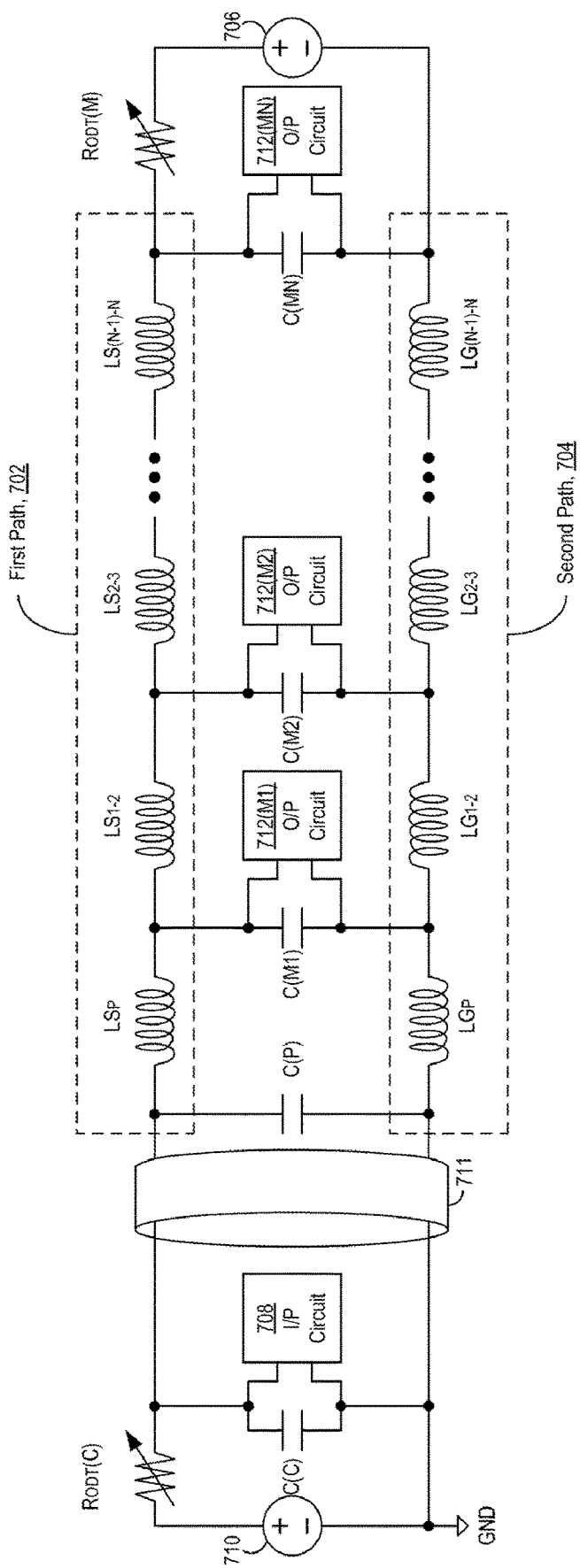
FIG. 7 is a partial circuit schematic of a circuit model of a single-ended transmission line, where a target uniform memory die of the N-number of uniform memory dies of FIG. 3 transmits a single-ended signal to the storage controller.
Figure 8:
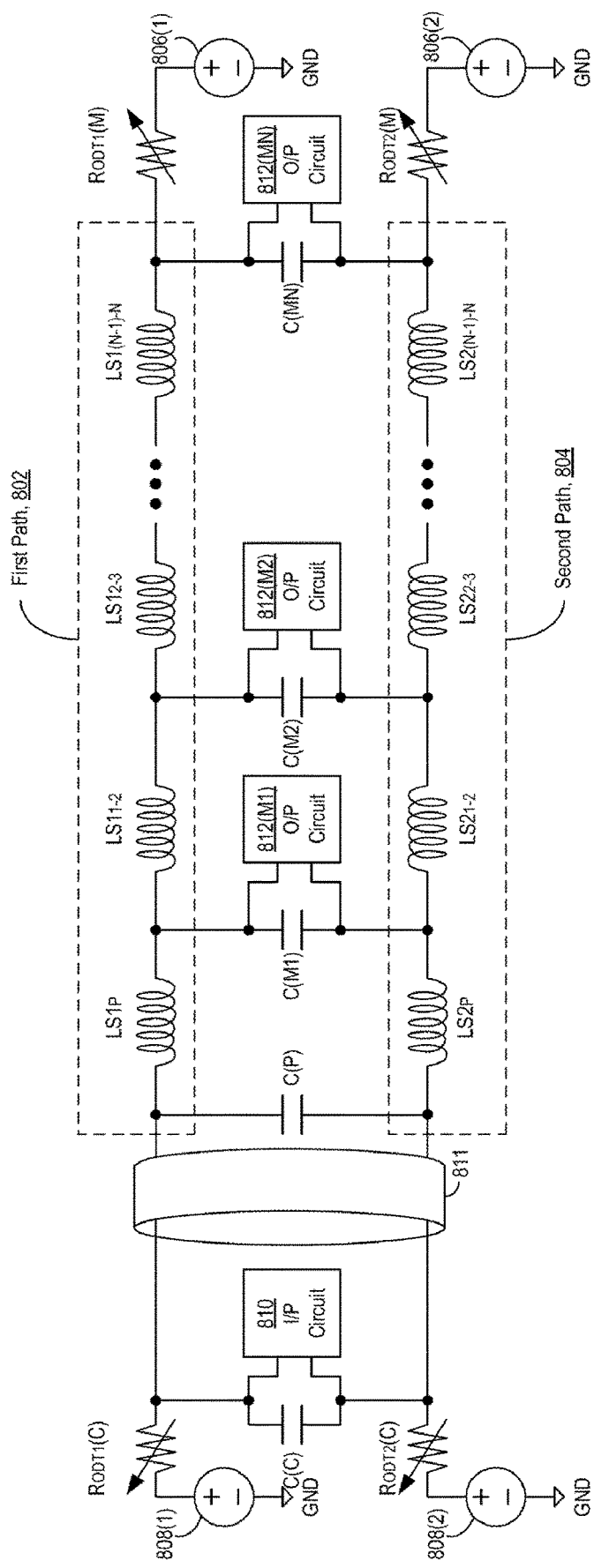
FIG. 8 is a partial circuit schematic of a circuit model of a differential transmission line, where a target uniform memory die of the N-number of uniform memory dies of FIG. 3 transmits a differential signal to the storage controller.

FIG. 5 to FIG. 8 are partial circuit schematic diagrams of circuit models of the transmission line between the storage controller die 102 and the plurality of uniform memory dies 304 of FIG. 3. FIG. 5 and FIG. 6 show circuit models for when the storage controller die 102 is transmitting the signal on the transmission line. FIG. 7 and FIG. 8 show circuit models for when a kth target memory die 104($k$) is transmitting the signal on the transmission line. Additionally, FIG. 5 and FIG. 7 show circuit models of the transmission line configured as a single-ended transmission line. FIG. 6 and FIG. 8 show circuit models of the transmission line configured as a differential transmission line.

Referring particularly to FIG. 5 (and also back to FIG. 3 and FIG. 4), the circuit model includes two paths of the transmission line, including a first path 502 and a second path 504. The first path 502 may be the signal path and the second path 504 may be the ground path of the single-ended transmission line. In this manner, the transmission line disclosed herein may be a single-ended transmission line.

In general, the conductive elements of the paths may be represented by, or modeled as, inductors or inductive elements that provide an inductance to the transmission line. The inductive elements of the first, signal path 502 are represented by inductors LS, and the inductive elements in the second, ground path 504 are represented by inductors LG. The transmission line model may also include capacitors C to represent capacitive elements of or coupled to the transmission line. The capacitive elements may include the substrates in which the conductive/inductive elements are disposed or coupled to, such as the substrates of the uniform memory dies 304, the die substrate 404, or circuit parasitic loading, as examples. In general, the inductive elements LS or LG of a given path are connected in series with each other, and are connected in shunt with the capacitive elements C. In simpler models, the inductance of the ground path 504 may be "folded" into the inductance of the signal path 502.

In the signal path, the inductance provided by the first PCB and packaging portions 306_1, 308_1 may be represented by inductor LSp; an inductance provided by the first wire bond element 310(1) and (optionally) by the I/O contact pads of the first and second I/O contact pad 312(1) and/or 312(2) that are part of the first path may be represented by inductor $LS_{1-2}$; an inductance provided by the second wire bond element 310(1) and (optionally) by the I/O contact pads of the second and/or third I/O contact pads 312(2), 312(3) that are part of the first path may be represented by inductor $LS_{2-3}$; and extend to an inductance provided by the (N−1)th wire bond element 310(N−1) and (optionally) by the I/O contact pads of the (N−1)th and/or Nth I/O contact pads 312(N−1), 312(N) that are part of the first path may be represented by inductor $LS_{(N-1)-N}$. The inductive components of the second, ground path 504 may be similarly represented by inductors LGp, $LG_{1-2}$, $LG_{2-3}$, and extend to $LG_{(N-1)-N}$.

The circuit model of the single-ended transmission path may further include a capacitor C(P), which may represent capacitance provided by capacitive elements over which the inductive packaging portions 306, 308 extend, such the die substrate 404. The circuit model may also include capacitors C(M1), C(M2), and extending to C(MN) connected in shunt with the signal and ground paths 502, 503. The capacitors C(M1), C(M2), and extending to C(MN) may represent the capacitance provided by the die substrates of the first uniform memory die 304(1), the second uniform memory die 304(2), and extending to the Nth uniform memory die 304(N), respectively.

Also, as shown in FIG. 5, a total, or effective termination resistance, as provided by the on-die termination circuits 314 may be represented by a memory-side ODT resistor $R_{ODT}(M)$. Also, in FIG. 5, a voltage source 506 may be included to represent a voltage offset for the termination to accommodate a voltage offset of a data signal source 510. For example, if the data signal source 510 signal amplitude is between ground (GND) and a power supply voltage, then the termination voltage source is at the power supply voltage. Other examples include near-ground signaling, where, the signal source 510 signal voltages are near GND, in which the voltage source would then be zero, GND level.

The circuit model may further include a single-ended signal generator 508, which may represent the circuitry of the storage controller die 102 that generates the signal transmitted on the single-ended transmission line. As shown in FIG. 5, the single-ended signal generator 508 may include the data signal source 510 configured to generate the signal. An example configuration of the data signal source 510 may be a step digital signal source, although other configurations may be possible. The data signal source 510 may include a first, positive terminal coupled to the signal path 502, and a second, negative terminal coupled to the ground path 504. Also, as shown in FIG. 5, the positive terminal may be coupled to the signal path 502 by way of a controller-side resistor $R_{ODT}(C)$, which may represent the controller-side termination resistance that the storage controller die 102 provides for the single-ended transmission line.

For completion, the circuit model of FIG. 5 also includes an example single-ended transmission line 511 connecting the storage controller die 102 to the plurality of uniform memory dies 304. The transmission line 511 in combination with the inductive and capacitive transmission line elements of the uniform memory dies 304 shown in FIG. 5 may represent a complete single-ended transmission line between the storage controller die 102 and the uniform memory dies 304.

Also, as shown in FIG. 5, the circuit model of the transmission line coupled to a plurality of input (I/P) circuits 512, including a first input circuit 512(M1), a second input circuit 512(M2), and extending to an Nth input circuit 512(MN). Each input circuit 512 may be a component of respective I/O driver circuitry 158 (FIG. 3). In particular example configurations, the input circuits 512 are configured as buffer circuits, although other configurations may be possible. Additionally, each input circuit 512 may be an input circuit of a respective one of the uniform memory dies 304 configured to receive the signal transmitted from the storage controller die 102. So, for example, the first input circuit 512(M1) may represent an input circuit of the first die 304(1), the second input circuit 512(M2) may represent an input circuit of the second die 304(2), and the Nth input circuit 512(MN) may represent an input circuit of the Nth die 304(N). In the circuit model, each ith input circuit 512(*i*) is coupled to a respective ith capacitor C(Mi), and includes a first input terminal coupled to a first end of ith capacitor C(Mi) and to the signal path 502, and a second input terminal coupled to a second end of the ith capacitor C(Mi) and to the ground path 504.

Referring particularly to FIG. 6, the differential circuit model may be similar to the single-ended circuit model of FIG. 5, except that first and second paths 602, 604 may both be signal paths, each configured to propagate a respective signal component of the differential signal. Inductive elements of the first signal path 602 are labeled LS1 and inductive elements of the second signal path 604 are labeled LS2. In this configuration, the transmission line disclosed herein may comprise a differential transmission line.

As a differential transmission line, the first signal path 602 may be terminated with a first memory-side termination resistance $R_{ODT1}(M)$ connected to a first voltage source 606(1) to represent a voltage offset for the termination to accommodate a voltage offset of a first data signal source 610(1). Similarly, the second signal path 604 may be terminated with a second memory-side termination resistance $R_{ODT2}(M)$ connected to a second voltage source 606(2) to represent a voltage offset for the termination to accommodate a voltage offset of a second data signal source 610(2).

The circuit model may further include a differential signal generator 608, which may represent the circuitry of the storage controller die 102 that generates the signal transmitted on the differential transmission line. As shown in FIG. 6, the differential signal generator 608 may include the first data signal source 610(1) configured to generate a first signal component of the differential signal. The first data signal source 610(1) may be coupled to the first signal path 602 by way of a first controller-side termination resistance $R_{ODT2}(C)$ of the storage controller die 102. In addition, the differential signal generator 608 may include a second data signal source 610(2) configured to generate a second signal component of the differential signal. The second data signal source 610(2) may be coupled to the second signal path 602 by way of a second controller-side termination resistance $R_{ODT2}(C)$ of the storage controller die 102. In some example configurations, the first and second data signal sources 610(1), 610(2) may be step digital signal sources, although other example configurations may be possible.

For completion, the circuit model of FIG. 6 also includes an example differential transmission line 611 connecting the storage controller die 102 to the plurality of uniform memory dies 304. The transmission line 611 in combination with the inductive and capacitive transmission line elements of the uniform memory dies 304 shown in FIG. 6 may represent a complete differential transmission line between the storage controller die 102 and the uniform memory dies 304.

In addition, similar to the single-ended circuit model, the differential transmission line may be coupled to a plurality of input circuits 612, each representing an input circuit, such as an input buffer of a respective one of the uniform memory dies 304, and configured to receive a differential signal transmitted from the differential signal generator 608. Each ith input circuit 612(Mi) may include a first input terminal coupled to a first end of a respective ith capacitor C(Mi) and the first signal path 602, and a second input terminal coupled to a second end of the ith capacitor C(Mi) and the second signal path 604.

Referring to FIG. 7, the single-ended circuit model of the transmission line is similar to the single-ended circuit model of the transmission line of FIG. 5, except that a kth die 304(k) is transmitting a signal on the transmission line instead of the storage controller die 102. Similar to the single-ended circuit model of FIG. 5, the transmission line model of FIG. 7 includes a first path 702, which may be a signal path of the single-ended transmission line, and a second path 704, which may be a ground path of the single-ended transmission line. Like the model of FIG. 5, the inductive components of the signal path 702 are labeled LS and the inductive components of the ground path 704 are labeled LG. As mentioned for FIG. 5, simpler models may "fold" the inductive components LG of the ground path 704 into the signal path 702. Also, the capacitive components of the uniform memory dies 304 C(M1), C(M2), and extending to C(MN) are connected in shunt with the signal and ground paths 702, 704. In addition, as shown in FIG. 7, the signal and ground paths 702, 704 are terminated with a memory-side termination resistance $R_{ODT}(M)$ provided by the on-die termination resistance circuits 314 of the uniform memory dies 304. The memory-side termination resistance $R_{ODT}(M)$ may be connected to a voltage source 706 to represent a voltage offset for the termination to accommodate a voltage offset of a data signal source of the kth die 304(k) transmitting the signal.

In FIG. 7, since a kth target die 304(k) is transmitting, the storage controller die 102 is receiving, and so the model includes the storage controller die 102 as including an input circuit 708, such as an input buffer, configured to receive a signal transmitted on the transmission line from the kth target die 304(k). Input terminals of the input circuit 708 may be connected across a capacitive element C(C) of the storage controller die 102. The capacitive element may represent a die capacitance provided by the storage controller die 102. Also, the first and second paths 702, 704 may be terminated by a controller-side termination resistance $R_{ODT}(C)$ provided by the on-die termination resistance of the storage controller die 102. The controller-side termination resistance $R_{ODT}(C)$ may be connected in series a voltage source 710 to represent a voltage offset for the termination to accommodate a voltage offset of a data signal source of the kth die 304(k) transmitting the signal.

For completion, the circuit model of FIG. 7 also includes an example single-ended transmission line 711 connecting the storage controller die 102 to the plurality of uniform memory dies 304. The transmission line 611 in combination with the inductive and capacitive transmission line elements of the uniform memory dies 304 shown in FIG. 7 may represent a complete single-ended transmission line between the storage controller die 102 and the uniform memory dies 304.

Also, in FIG. 7, instead of input circuits, the circuit model of the single-ended transmission line is coupled to output (O/P) circuits 712 located on the uniform memory dies 304, including a first output circuit 712(M1) on the first uniform memory die 304(1), a second output circuit 712(M2) on the second uniform memory die 304(2), and extending to a Nth output circuit 712(MN) on the Nth uniform memory die 304(N). Each ith output circuit 712(Mi) may be configured to generate and output a single-ended signal on the single-ended transmission line, such as with as data signal source (e.g., a step digital signal source). As shown in FIG. 7, each ith output circuit 712(Mi) includes a first output terminal connected to a first end of an associated capacitive element C(Mi) and to the signal path 702, and a second output terminal connected to a second end of the associated capacitive element C(Mi) and to the ground path 704.

Referring to FIG. 8, the differential circuit model is similar to the differential circuit model of FIG. 6, in that it includes a first signal path 802 and a second signal path 804. Inductive elements of the first signal path are labeled LS1, and inductive elements of the second signal path are labeled LS2. In addition, the first signal path 802 is terminated with a first memory-side termination resistance $R_{ODT1}(M)$ provided by on-die termination resistance circuits 314 coupled to the first signal path 802 of the differential transmission line, and the second signal path 804 is terminated with a second memory-side termination resistance $R_{ODT2}(M)$ provided by the on-die termination resistance circuits 314 coupled to the second signal path 804 of the differential transmission line. The memory-side termination resistances $R_{ODT1}(M)$, $R_{ODT2}(M)$ are each connected to respective voltage sources 806(1), 806(2) to represent a voltage offset for the termination to accommodate a voltage offset of a data signal source of the kth die 304(k) transmitting the signal.

In addition, since a kth target die 304(k) is transmitting on the differential transmission line for the differential model of FIG. 8, the first signal path 802 is also terminated with a first controller-side termination resistance $R_{ODT1}(C)$ provided by on-die termination resistance circuits of the storage controller die 102 coupled to the first signal path 802 of the differential transmission line, and the second signal path 804 is terminated with a second controller-side termination resistance $R_{ODT2}(C)$ provided by on-die termination resistance circuits of the controller di 102 coupled to the second signal path 804 of the differential transmission line. The controller-side termination resistances $R_{ODT1}(C)$, $R_{ODT2}(C)$ are each connected to respective voltage sources 808(1), 808(2) to represent a voltage offset for the termination to accommodate a voltage offset of a data signal source of the kth die 304(*k*) transmitting the signal.

Also, similar to the single-ended model of FIG. 7, since a kth target die 304(*k*) is transmitting, the storage controller die 102 includes an input circuit 810, such as an input buffer, configured to receive the differential signal. The input circuit 810 includes terminals connected across a capacitive element C(C) representing on-die capacitance of the storage controller die 102, with a first input terminal connected to the first signal path 802 and a second input terminal connected to the second signal path 804.

For completion, the circuit model of FIG. 8 also includes an example differential transmission line 711 connecting the storage controller die 102 to the plurality of uniform memory dies 304. The transmission line 611 in combination with the inductive and capacitive transmission line elements of the uniform memory dies 304 shown in FIG. 7 may represent a complete differential transmission line between the storage controller die 102 and the uniform memory dies 304.

In addition, similar to the single-ended model of FIG. 7, the differential transmission line is coupled to output circuits 812, each configured to generate and output a differential signal on the differential transmission line, including a first output circuit 812(M1) on the first uniform memory die 304(1), a second output circuit 812(M2) on the second uniform memory die 304(2), and extending to an Nth output circuit 812(MN) on the Nth uniform memory die 304(N). Each ith output circuit 812(Mi) may include output terminals coupled across an associated capacitive element C(Mi) representing on-die capacitance of a respective uniform memory die 304(*i*), and includes a first terminal connected to the first signal path 802 and a second terminal connected to the second signal path 804.

Referring back to FIG. 3, a characteristic impedance of the transmission line between the storage controller die 102 and the N-number of uniform memory dies 304(1) to 304(N) may be modeled by its inductive and capacitive elements, and may be equal to or proportionate to the square root of an equivalent inductance of the inductive elements divided by an equivalent capacitance of the capacitive elements. In some example configurations, it may be desirable to increase the effective inductance in order to increase the characteristic impedance, such as in order to more closely match an end-die termination resistance. One way to do so is by increasing the inductance of one or more wire bond elements 310 of the transmission line.

Figure 9:
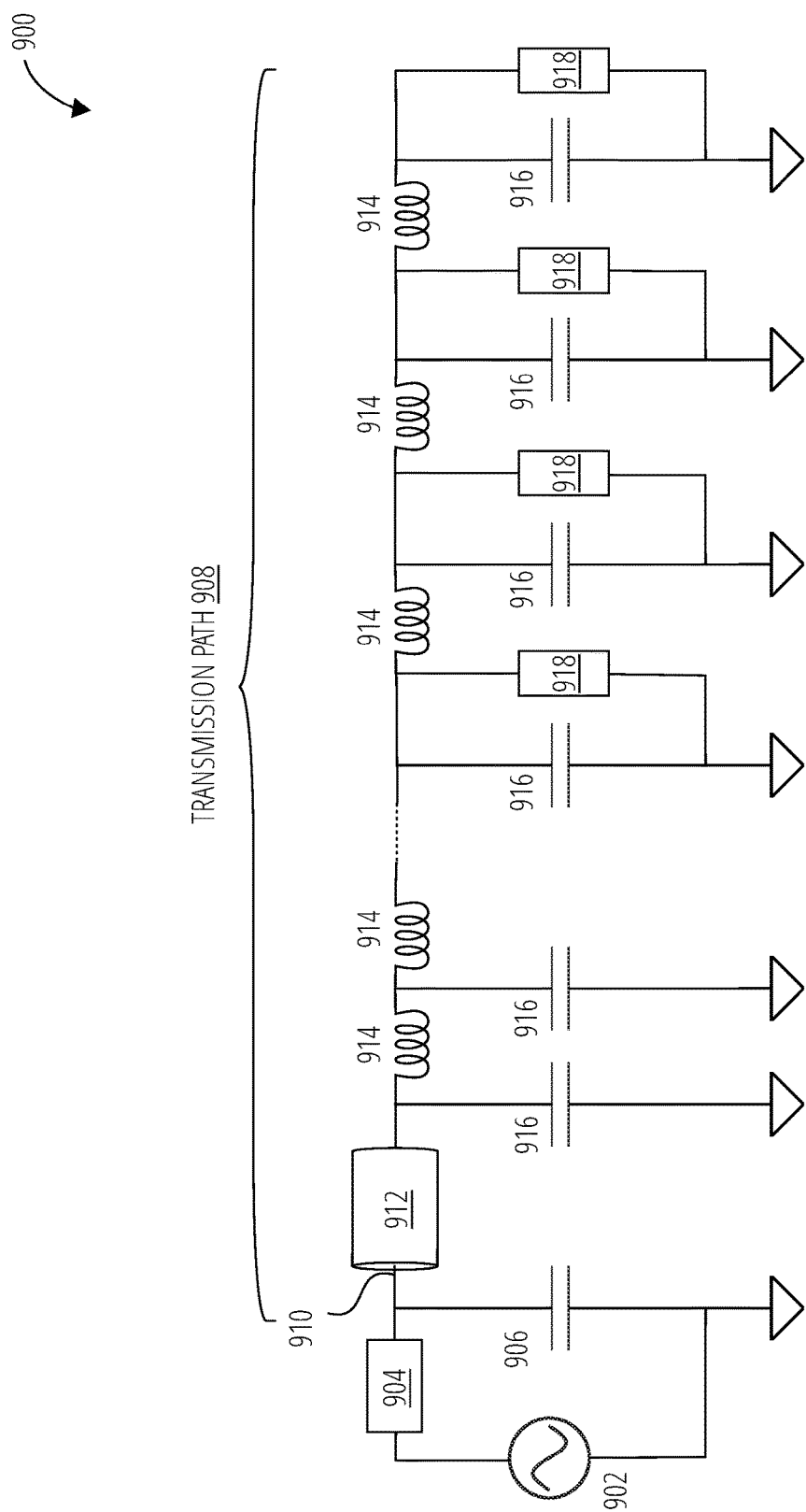
FIG. 9 illustrates a die stack interconnect model 900 in accordance with one embodiment.

FIG. 9 illustrates a die stack interconnect model 900. The storage controller introduced in previous drawings may be modeled as a variable voltage source 902, an impedance 904, and a parasitic capacitance 906. The transmission path 908 first introduced in FIG. 3 may be modeled as a transmission line 910 having a characteristic impedance 912, and a series of parasitic capacitance elements 916 and inductance elements 914 incurred by the die stack interconnections.

"Impedance" refers to a measure of the opposition that a circuit presents to a current when a voltage is applied.

Quantitatively, the impedance of a two-terminal circuit element is the ratio of the complex representation of the sinusoidal voltage between its terminals, to the complex representation of the current flowing through the circuit. In general, impedance depends upon the frequency of the sinusoidal voltage.

Impedance extends the concept of resistance to alternating current (AC) circuits, and possesses both magnitude and phase, unlike resistance, which has only magnitude. Impedance is a complex number, with the same units as resistance, for which the SI unit is the ohm ($\Omega$). Its symbol is usually Z, and it may be represented by writing its magnitude and phase in the polar form $|Z|\angle\theta$. However, cartesian complex number representation is often more powerful for circuit analysis purposes. (Search "impedance" on Wikipedia.com May 31, 2020. Modified. Accessed Jun. 2, 2020.)

"Characteristic impedance" refers to a ratio of the amplitudes of voltage and current of a single signal wave propagating along the line; that is, a wave travelling in one direction in the absence of reflections in the other direction. Characteristic impedance (usually written $Z_0$) is typically defined in relation to a uniform transmission line. Alternatively, and equivalently, characteristic impedance can be defined as the input impedance of a transmission line when the transmission line's length is infinite. Characteristic impedance is determined by the geometry and materials of the transmission line and, for a uniform transmission line, is not dependent on the uniform transmission line's length. The SI unit of characteristic impedance is the ohm.

The characteristic impedance of a lossless transmission line is purely real, with no reactive component. Energy supplied by a source at one end of such a line is transmitted through the line without being dissipated in the line itself. A transmission line of finite length (lossless or lossy) that is terminated at one end with an impedance equal to the characteristic impedance appears to the source like an infinitely long transmission line and produces no reflections. (Search "characteristic impedance" on Wikipedia.com May 17, 2020. Modified. Accessed Jun. 2, 2020.)

"Parasitic capacitance" refers to an unavoidable and usually unwanted capacitance that exists between the parts of an electronic component or circuit simply because of their physical proximity to each other. When two electrical conductors at different voltages are close together, the electric field between them causes electric charge to be stored on them; this effect is parasitic capacitance. Circuit elements such as inductors, diodes, and transistors have internal capacitance, which can cause their behavior to depart from that of 'ideal' circuit elements. Additionally, there is always non-zero capacitance between two conductors; this parasitic capacitance can be significant at higher frequencies with closely spaced conductors, such as wires or printed circuit board traces. (Search "parasitic capacitance" on Wikipedia.com Mar. 16, 2020. Modified. Accessed Jun. 2, 2020.)

In the die stack interconnect model 900 illustrated, parasitic capacitance element 916 and inductance element 914 represent the interconnection with the first memory die in the die stack. Parasitic capacitance element 916 and inductance element 914 represent the connection of the next die in the stack, and so on. Inductance element 914 and parasitic capacitance element 916 represent the connection to the end die.

In order to match the impedance of the entire transmission path 908 and reduce signal reflections along the path, on-die termination resistance circuit 918 may be provided on a plurality of uniform memory dies of the die stack farthest from the storage controller. In the illustrated model of one embodiment, four on-die termination resistance circuits 918 of the last four uniform memory dies may be activated to provide distributed on-die electrical termination for the transmission path 908. The transmission path 908 impedance may be considered the aggregate of all of the elements along the transmission path 908, including the transmission line characteristic impedance 912, the parasitic capacitances, and the inductances shown. The on-die termination resistance circuits 918, therefore, may be configured to terminate transmission line effects due to these components.

Figure 10:
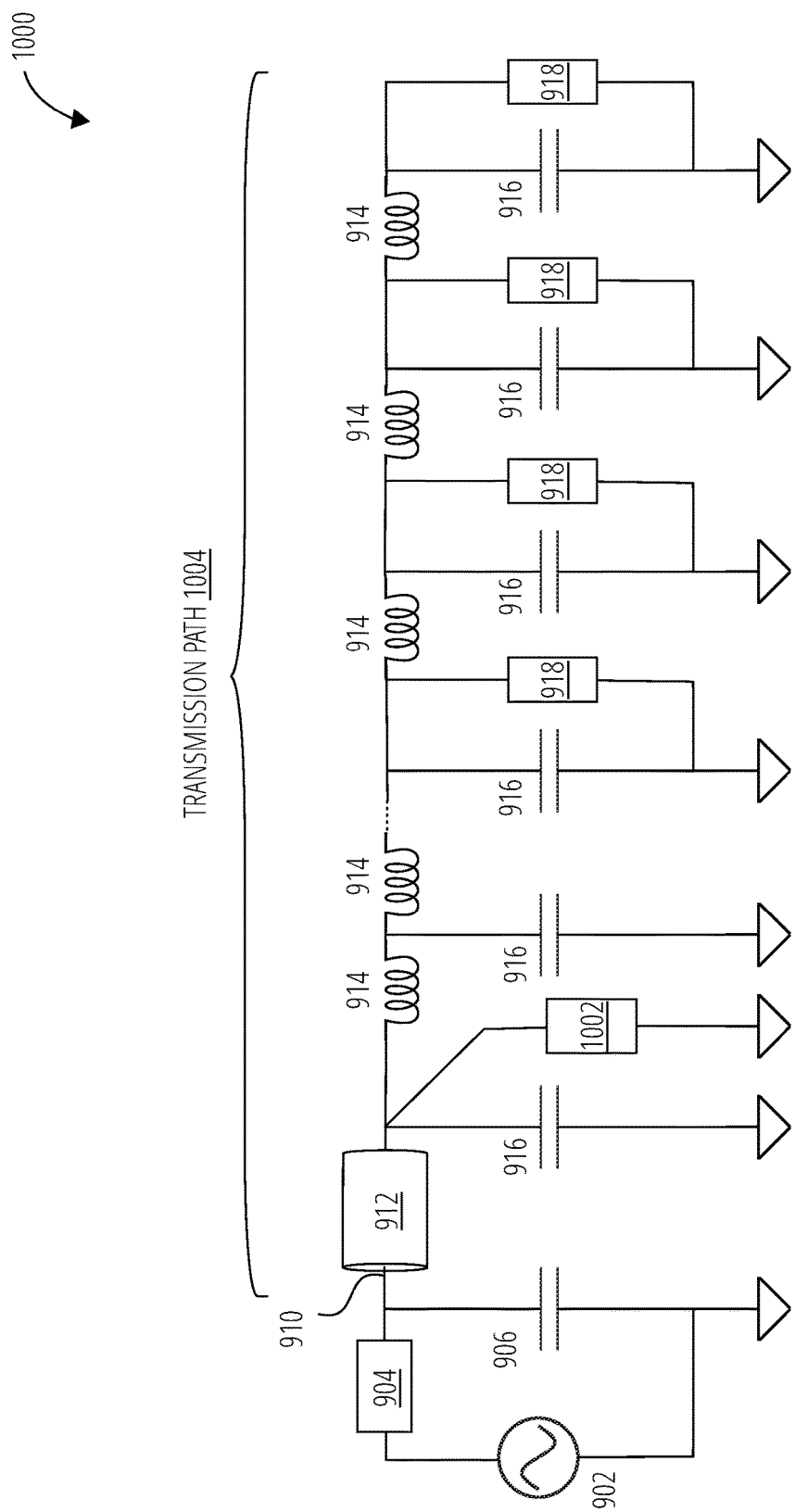
FIG. 10 illustrates a die stack interconnect model 1000 in accordance with one embodiment.

FIG. 10 illustrates a die stack interconnect model 1000 with active die electrical termination 1002. In addition to the on-die termination resistance circuits 918 of a plurality of uniform memory dies at the end of the transmission path 908/transmission path 1004 introduced in FIG. 9, which counteracts the transmission line effects along the entire transmission path 1004 by introducing a distributed end-die termination resistance, active die electrical termination 1002 may be provided to counteract the additional effects incurred at a specific memory die when a particular uniform memory die is in active use, e.g., is being read from, is the sender of a data signal.

Active die electrical termination 1002 is often configurable such that it may be switched on or off and/or use a programmable termination resistance. Thus, active die electrical termination 1002 circuitry may be switched on to sink reflections and other noise at an active die when that die is in use, but may be switched off when that die is not in use, in order to conserve power, and so as not to incur additional reflections along the transmission path 1004. The active die electrical termination 1002 shown is associated with the node representing the first memory die in the die stack, also characterized by parasitic capacitance element 916 and inductance element 914, in order to model active die electrical termination 1002 when a first die is active. A similar structure may be modeled having a similar relationship to parasitic capacitance element 916 and inductance element 914 in order to model active die electrical termination 1002 while a second memory die is active, a third memory die is active, and so on.

Figure 11:
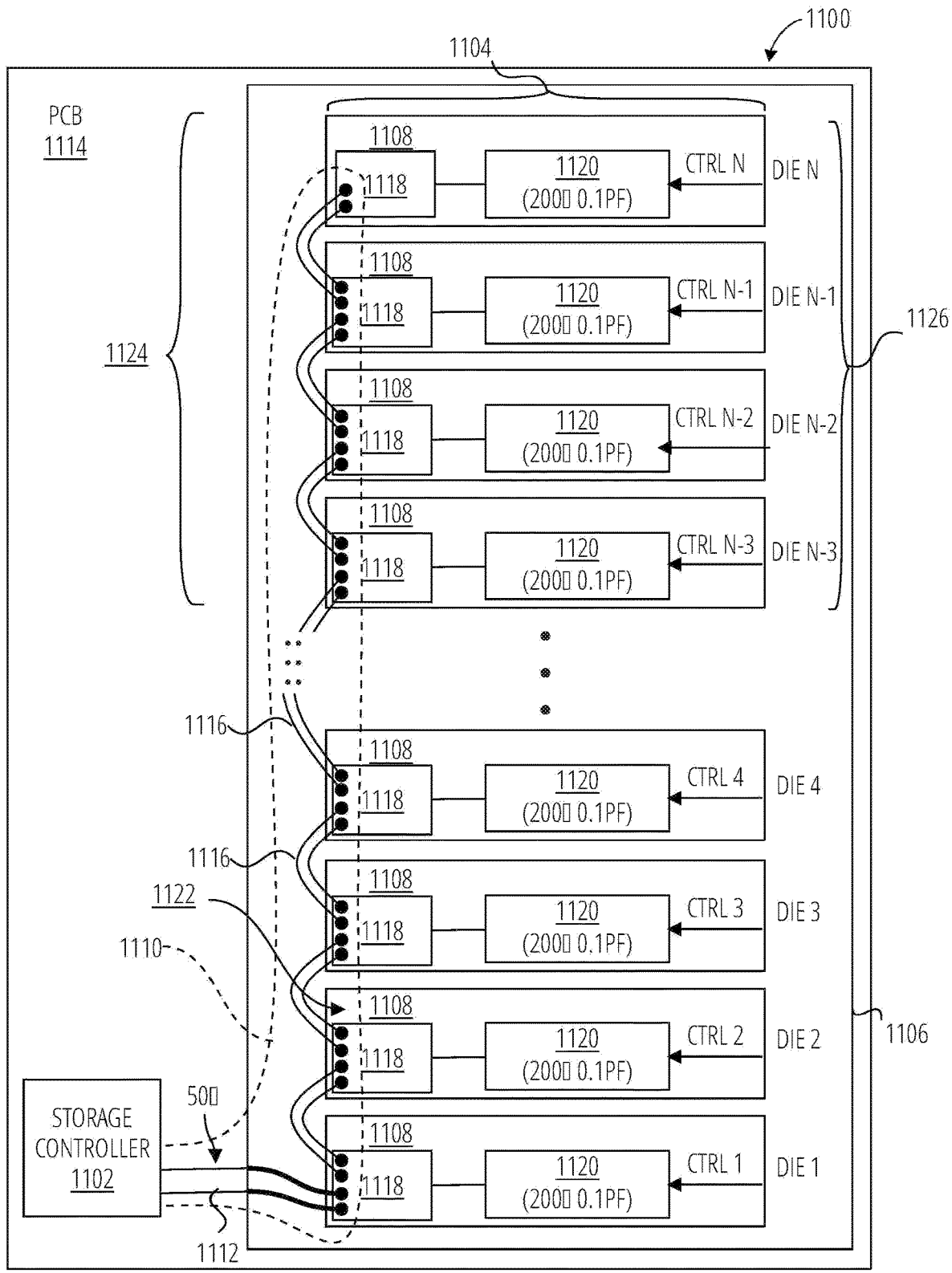
FIG. 11 is a block diagram of a storage controller and an N-number of uniform memory dies in a memory system in accordance with one embodiment.

FIG. 11 illustrates an example memory system 1100 in accordance with one embodiment. A storage controller 1102 connects with a stack of uniform memory dies 1104, which may be grouped within packaging 1106. The storage controller 1102 and uniform memory dies 1108 may be connected by a transmission path 1110 that includes transmission lines 1112 on a printed circuit board 1114, on which the storage controller 1102 and uniform memory dies 1108 and/or their packaging 1106 may be mounted. The transmission path 1110 may also include wire bonds 1116 that connect each uniform memory die 1108 in series, as shown.

"Stack of uniform memory dies" refers to a group of two or more uniform memory dies arranged in a stacked configuration relative to each other. In one embodiment, each member of the group of uniform memory die is positioned directly above or directly below either another uniform memory die or a substrate.

In one embodiment, each uniform memory die of the stack is positioned relative to the others to form a staircase structure, with each uniform memory die being one of the "steps" of the staircase.

Each uniform memory die 1108 may comprise an I/O contact pad 1118 for attachment of the wire bonds 1116. The I/O contact pad 1118 may connect to an on-die termination resistance circuit. In certain embodiments, the on-die termination resistance circuit is a programmable resistance circuit 1120. Examples of a programmable resistance circuit 1120 are illustrated in further detail in FIG. 13-FIG. 15. The programmable resistance circuit 1120 may, in one embodiment, provide a minimum termination resistance.

The storage controller 1102 may address a target uniform memory die 1122 of the stack of uniform memory dies 1104 for an operation. "Target uniform memory die" refers to a uniform memory die configured to communicate with a storage controller to complete an operation.

The storage controller 1102 may enable the on-die termination resistance circuits of a plurality of uniform memory dies 1124 along the transmission path 1110. The storage controller 1102 may then transmit a data signal for the operation to the target uniform memory die 1122 with the on-die termination resistance circuits enabled for the plurality of uniform memory dies 1124. In the illustrated example, the plurality of uniform memory dies 1124 includes four adjacent uniform memory dies positioned at one end (on the memory side) of the transmission path 1110. In another example, the plurality of uniform memory dies 1124 includes two adjacent uniform memory dies positioned at one end (on the memory side) of the transmission path 1110.

The storage controller 1102 may, in one embodiment, transmit the data signal at a frequency greater than 1600 Hz. The stack of uniform memory dies 1104 may, in another embodiment, comprise more than four uniform memory dies 1108, and the plurality of uniform memory dies 1124 enabled for an operation or a portion of an operation may comprise more than two uniform memory dies 1108. In one embodiment, enabling the programmable resistance circuit 1120 of the plurality of uniform memory dies 1124 creates an effective termination resistance 1126 for the transmission path 1110 that is less than a minimum termination resistance of any one of the uniform memory dies 1108 individually of the stack of uniform memory dies 1104.

In certain embodiments, the programmable resistance circuit 1120 may be configured to connect to the transmission line 1112 in response to a uniform memory die 1108 being powered on and/or enabled (e.g., receiving an enable signal). The programmable resistance circuit 1120 may comprising programmable resistance circuit configured to provide a termination resistance during transmission of a data signal to a target uniform memory die 1122.

In such embodiments, the storage controller 1102 may send a storage command to a target uniform memory die 1122 of the stack of uniform memory dies 1104 for an operation. "Storage command" refers to any command relating to an operation. Examples of storage commands include, but are not limited to, read commands, write commands, maintenance commands, configuration command, administration command, diagnostic commands, test mode commands, countermeasure command, and any other command a storage controller may receive from a host or issue to another component, device, or system. In general, a storage command is a command issued to a storage or memory device from a host or master or another component or device. A storage command typically initiates one or more operations.

"Operation" refers to an operation performed on, within, to, or in relation to, a processor, a logic component, a memory, a storage device and/or storage media (non-volatile or volatile). Examples of operations include, but are not limited to, a power on reset operation, a firmware initialization operation, a data refresh operation, a data scrub operation, a garbage collection operation, an erase operation, a maintenance operation, a test mode operation, a program storage operation, a read scan operation, a host memory buffer access operation, a host memory buffer maintenance operation, a cache access operation, a compute operation, a cache maintenance operation, a memory address translation lookup operation, a memory address translation cache swapping/paging operation, a storage command, and the like. Further examples of operations include but are not limited to, reading data from (or sensing a state of) a memory cell, writing (or programming) data to a memory cell, and/or erasing data stored in a memory cell.

The storage controller 1102 may direct at least four uniform memory dies 1108 along the transmission path 1110 to provide termination resistance during the operation. The at least four uniform memory dies 1108 may be different from the target uniform memory die 1122, as illustrated by the plurality of uniform memory dies 1124. The storage controller 1102 may then transmit a plurality of data signals for the operation to the target uniform memory die 1122 with the at least four uniform memory dies 1108 (the plurality of uniform memory dies 1124) generating an effective termination resistance 1126 for the transmission path 1110 during the operation.

The at least four uniform memory dies 1108 directed to provide termination resistance during the operation may provide a distributed termination resistance that substantially matches a characteristic impedance of the transmission line 1112. "Distributed termination resistance" refers to termination resistance that includes termination resistance contributed by two or more electronic components along a transmission line or transmission path. In one embodiment, where two termination resistance circuits are connected in series as stubs, the two termination resistance circuits contribute a termination resistance to a transmission line or transmission path as though the two termination resistance circuits were connected in a DC circuit in parallel.

For example, suppose each uniform memory die includes a programmable resistance circuit 1120 configured to provide an electrical termination of no less than 200 ohms (e.g., a minimum termination resistance). This means that the increased parasitic capacitance of adding each uniform memory die is about 0.1 pF which facilitates matching the impedance from the transmission line to the end of the stack of uniform memory dies, adding more uniform memory die to a die stack of uniform memory dies, increasing bandwidth and/or signal frequency. If the target uniform memory die 1122 is activated by the storage controller 1102 and the programmable resistance circuits 1120 of the plurality of uniform memory dies 1124 are activated/enabled such that each programmable resistance circuits 1120 of the plurality of uniform memory dies 1124 provides 200 ohms of termination resistance, the effective termination resistance provided by the plurality of uniform memory dies 1124 is 50 ohms, which matches the impedance of the transmission line 1112.

The programmable resistance circuit 1120 may be configured to provide a range of termination resistance between the minimum termination resistance and a maximum termination resistance. "Minimum termination resistance" refers to a level, value, or quantity that is the lowest electrical termination resistance or termination impedance that a device, apparatus, circuit, sub-circuit is physically capable of providing when coupled or connected to a transmission line and/or transmission path carrying an electrical signal. "Maximum termination resistance" refers to a level, value, or quantity that is the highest or greatest electrical termination resistance or termination impedance that a device, apparatus, circuit, sub-circuit is physically capable of providing when coupled or connected to a transmission line and/or transmission path carrying an electrical signal.

There is an inverse relationship between an amount parasitic capacitance each additional uniform memory die contributes to the transmission path when added to the stack of uniform memory dies and the amount of on-die termination resistance the added uniform memory die adds to the transmission path. Specifically, a minimum termination resistance added to the transmission path by adding another uniform memory die (when the on-die termination resistance circuit is connected to the transmission path, regardless of whether the on-die termination resistance circuit is activated or powered on or enabled) is inversely related to the amount of parasitic capacitance the added uniform memory die adds.

For example, if the minimum termination resistance for a uniform memory die (including any on-die termination resistance circuit) is 200 ohms, the parasitic capacitance contributed by such a uniform memory die is 0.1 pF. If the minimum termination resistance for a uniform memory die (including any on-die termination resistance circuit) is 100 ohms, the parasitic capacitance contributed by such a uniform memory die is 0.2 pF. If the minimum termination resistance for a uniform memory die (including any on-die termination resistance circuit) is 50 ohms, the parasitic capacitance contributed by such a uniform memory die is 0.4 pF. Consequently, in order to reduce the added parasitic capacitance to support more than 4, 8, or 16 memory dies in a stack of uniform memory dies, the on-die termination resistance circuit may be designed to have a minimum termination resistance of greater than 100 ohms, or 200 ohms, or even 300 ohms. The disclosed embodiments may be configured to have a predefined minimum termination resistance such that the parasitic capacitance by each added uniform memory die is kept as low as practical.

Figure 12:
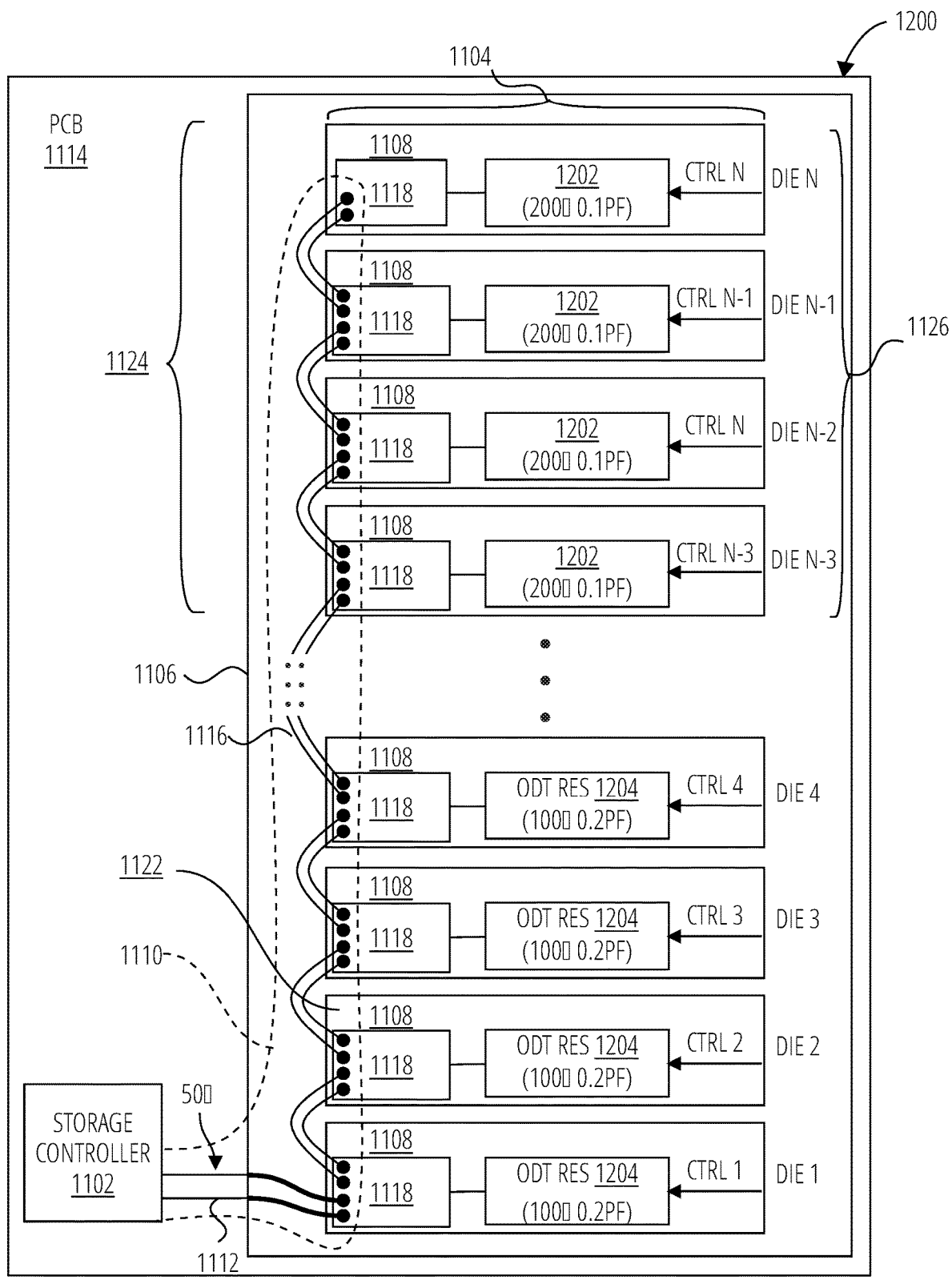
FIG. 12 is a block diagram of a storage controller and an N-number of uniform memory dies in a memory system in accordance with one embodiment.

FIG. 12 illustrates an example memory system 1200 in accordance with one embodiment. The example memory system 1200 may in large part comprise the components introduced and described with regard to FIG. 11 and example memory system 1100.

In one embodiment, the stack of uniform memory dies 1104 may comprise eight uniform memory dies 1108. The plurality of uniform memory dies 1124 may comprise at least the four end dies (die N–3 through die N). The programmable resistance circuit 1202 of each of the plurality of uniform memory dies 1124 may be programmed to 200 ohms. Consequently, each of the plurality of uniform memory dies 1124 may contribute 0.1 pF of parasitic capacitance. However, the programmable resistance circuit 1202 may be capable of providing a termination resistance of as low as 100 ohms. However, because the plurality of uniform memory dies 1124 contribute to the effective termination resistance as though these memory dies were connected in parallel, the effective termination resistance for the transmission path, minus the transmission line 1112 is 50 ohms, which substantially matches the impedance of the transmission line 1112.

Advantageously, the plurality of uniform memory dies 1124 programmed to 200 ohms means that the plurality of uniform memory dies 1124 each contribute a nominal 0.1 pF of parasitic capacitance. In addition, each of the uniform memory dies of the stack of uniform memory dies 1104 is configured to provide no less than the minimum termination resistance (e.g., 100 ohms in the illustrated embodiment, see programmable resistance circuit 1204). As illustrated, the programmable resistance circuit 1204 of the uniform memory dies that are not activated/enabled and/or powered on is at least 100 ohms, a minimum termination resistance, and these uniform memory dies contribute a nominal 0.2 pF of parasitic capacitance. In one embodiment, the programmable resistance circuit 1120, programmable resistance circuit 1202, and/or programmable resistance circuit 1204 are programmed, designed, engineered, and/or manufactured to achieve a desired minimum termination resistance. In one embodiment, termination resistance circuits may be such that the minimum termination resistance is configured such that a parasitic capacitance contributed by each of a plurality of uniform memory dies in a stack of uniform memory dies is reduced by 25%.

The programmable resistance circuit 1202 and programmable resistance circuit 1204 may be configured using a combination of one or more of active resistance circuits and passive resistance circuits, based on design and on control signals sent from the storage controller 1102, illustrated here for each uniform memory die 1108 as "CTRL 1", "CTRL 2", etc., through "CTRL N".

Figure 13:
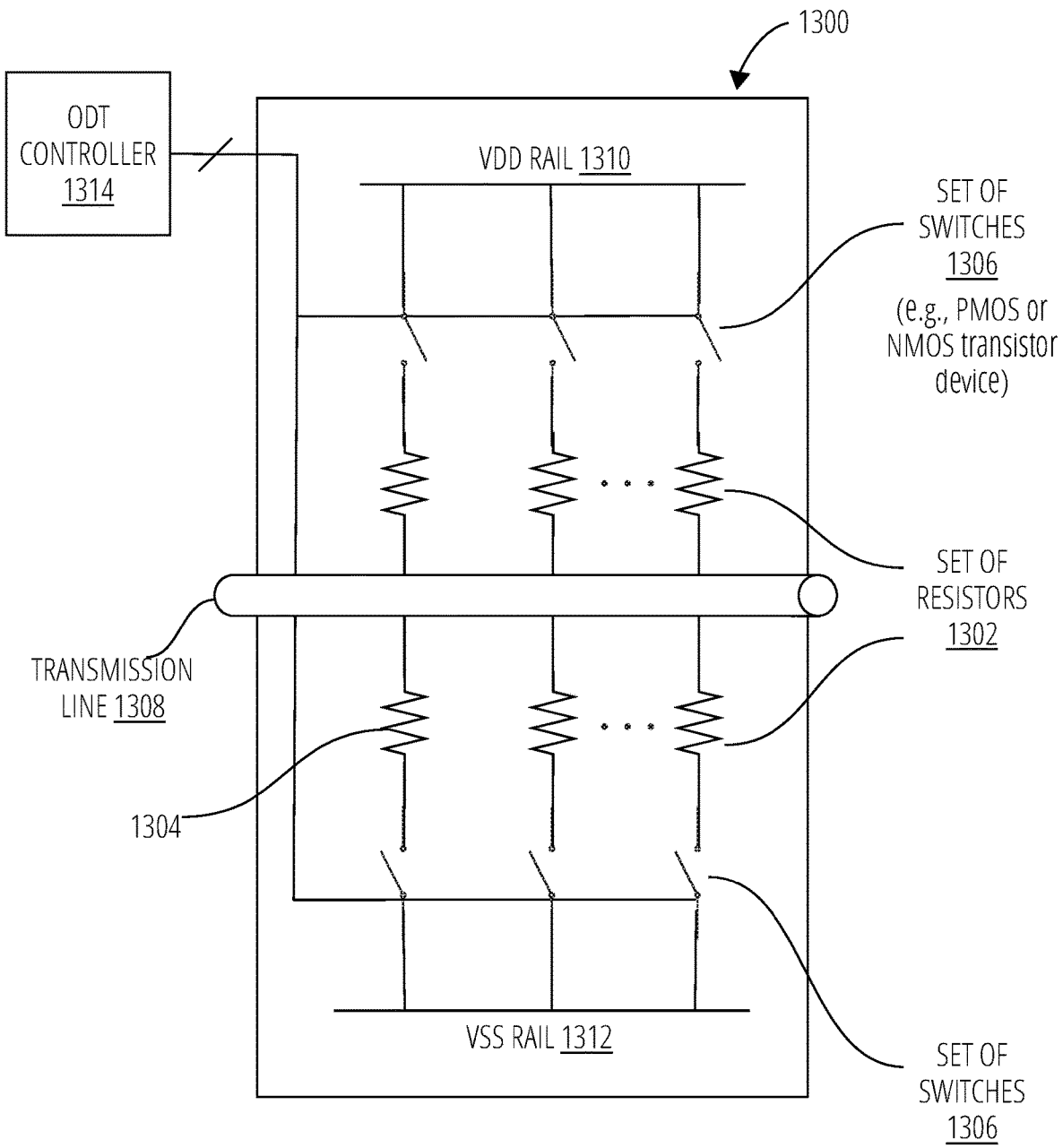
FIG. 13 illustrates programmable resistance circuit 1300 in accordance with one embodiment.

FIG. 13 illustrates an exemplary arrangement of a programmable resistance circuit 1300 that may be used to reduce mismatch reflections and improve the signal integrity and bandwidth of high-bandwidth transmission line. The programmable resistance circuit 1300 may be similar in form, capability, and operation to the ODT termination resistance circuit 162, programmable resistance circuit 314, programmable resistance circuit 1120, programmable resistance circuit 1202, and/or programmable resistance circuit 1204. "Programmable resistance circuit" refers to a type of on-die termination resistance circuit that includes a capability for changing a level of termination resistance based a data value, a register setting, logic, and/or how one or more switching components, such as transistors, are configured. The programmable resistance circuit is configured to provide a variable level of termination resistance. In certain embodiments, the programmable resistance circuit increases termination resistance by adding resistive elements in parallel by activating switches in the circuit.

It should be noted that while a programmable resistance circuit is configured to provide a variable level of termination resistance based on a programmable resistance setting, the physical configuration of the programmable resistance circuit and its electronic components may result in the programmable resistance circuit providing one or more of a minimum termination resistance and a maximum termination resistance.

"Programmable resistance setting" refers to a value used by a programmable resistance circuit to provide a configurable termination resistance. In one embodiment, a programmable resistance setting defines which switches of a set of switches a programmable resistance circuit will set/activate or unset/deactivate such that the programmable resistance circuit provides a desired level of termination resistance.

The programmable resistance circuit 1300 may include a set of resistors 1302, comprising one or more resistive elements 1304, which may be arranged in parallel along the transmission line 1308, between each transmission line 1308 to the power rail 1310, as well as between the transmission line 1308 and the power reference rail 1312. "Resistive element" refers to an electronic component configured to provide electrical resistance to a current passing through the resistive element. Examples of a resistive element include, but are not limited to, a resistor, a capacitor, a transistor, a transistor configured to operate in its active region, and the like. In certain embodiments, each resistive element 1304 may provide a different level of termination resistance relative to the other resistive elements 1304 of the set of resistors 1302.

A storage controller and/or an ODT controller 1314 may activate and/or deactivate (open and close) the set of resistors 1302 dynamically and/or individually, to tune the termination resistance of the programmable resistance circuit 1300 to match impedance of the transmission line 1308.

The set of switches 1306 may be controlled by the ODT controller 1314 to tune the impedance of the transmission line 1308 to the data rate. For example, assume an array of three 100Ω resistors connected in parallel between a typical transmission line and the power reference rail 1312 (e.g., signal ground). Impedance matching may be performed by switching in a resistance of between 50Ω and 75Ω on the transmission line. This may be achieved by toggling the set of switches 1306 to connect two of the set of resistors 1302 to the power reference rail 1312, for an effective added resistance of 50Ω. This added resistance may dampen high frequency noise artifacts out of the signal on the transmission line 1308, leading to a cleaner data transmission. The set of resistors 1302 improve the termination alignment and allow transmission at a high data rate.

In one embodiment, the on-die termination resistance circuit comprises an active resistance circuit, configured from the set of resistors 1302 and set of switches 1306 illustrated. "Active resistance circuit" refers to a type of on-die termination resistance circuit that uses primarily active electronic components. Examples of the active electronic components include transistors, diodes, and/or integrated circuits. This on-die termination resistance circuit may be a programmable resistance circuit, with the ODT controller 1314 setting or releasing switches of the set of switches 1306 in order to configure a variable resistance through the set of resistors 1302. The programmable resistance circuit may comprise a parallel circuit formed from the set of resistors and set of switches illustrated as set of resistors 1302 and set of switches 1306.

"Parallel circuit" refers to a circuit that includes one or more of active electronic components and/or passive electronic components arranged such that at least two of the electronic components are connected in parallel. In certain embodiments, the parallel circuit includes a set of resistors configured to be connected in parallel by way of a set of switches.

This programmable resistance circuit may be activated by a die controller of the plurality of uniform memory dies, which may incorporate a logic structure such as the ODT controller 1314, based on a programmable resistance setting stored in a register of the die controller. "Register" refers to a temporary storage location used to store an address, or a data value, used in a computing operation by a processor, circuit, or logic. Certain registers may be named based on a type of data the register normally stores such as an address register that stores addresses or a data register that stores data or an operand register that stores values used in a firmware instruction. A register may be implemented with logic gates, flip-flops, SRAM, or the like.

Figure 14:
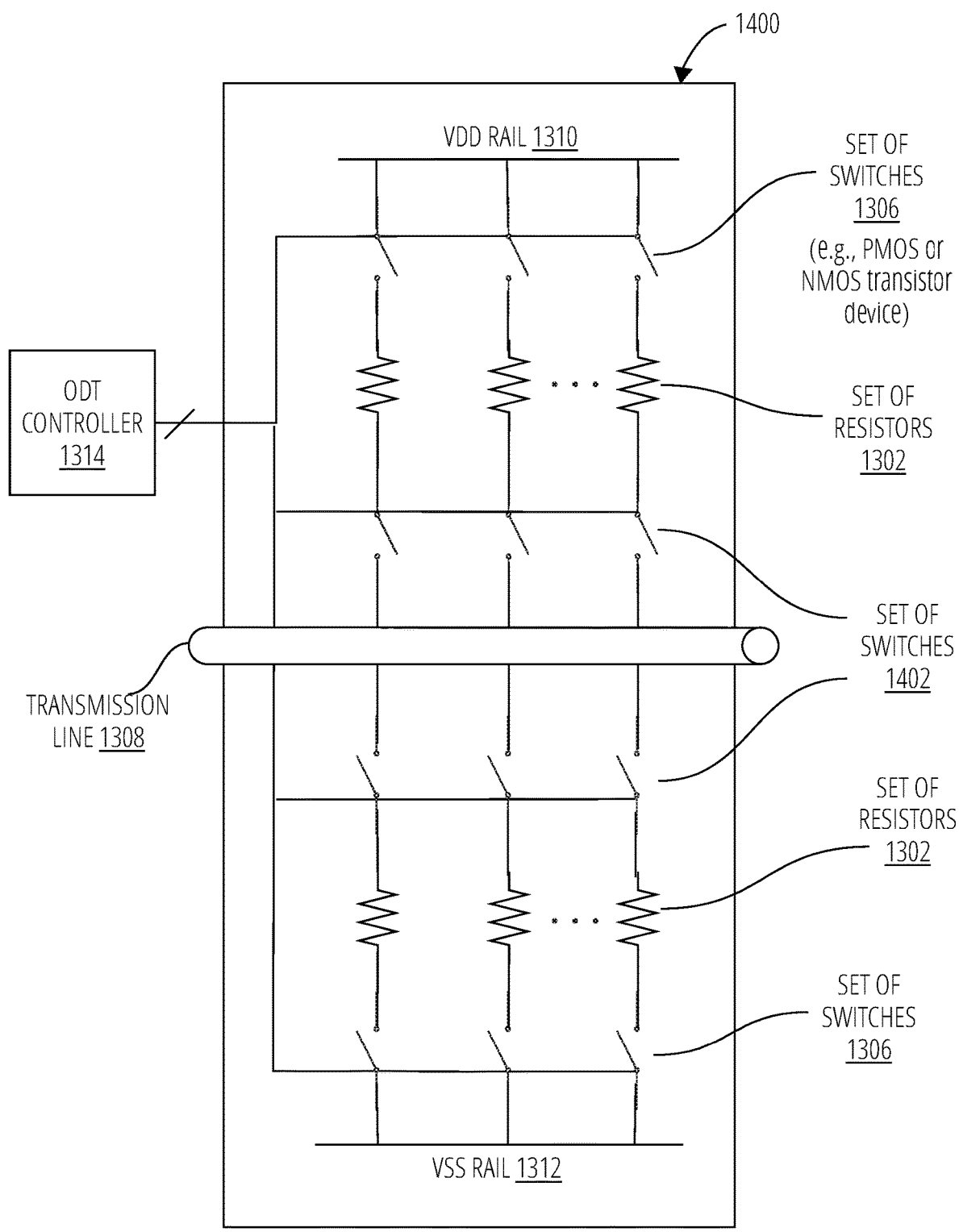
FIG. 14 illustrates programmable resistance circuit 1400 in accordance with one embodiment.

FIG. 14 illustrates an exemplary arrangement of programmable resistance circuit 1400 that may be used to reduce mismatch reflections and improve the signal integrity and bandwidth of high-bandwidth transmission lines. The programmable resistance circuit 1400 may be similar to the programmable resistance circuit 1300 of FIG. 13, except that transmission line 1308 may be disconnected from the programmable resistance circuit 1400 until one or more switches in the set of switches 1402 are activated by ODT controller 1314.

The set of set of switches 1402 may selectively connect the set of resistors 1302 that connect to the power rail 1310 and the set of resistors 1302 that connect to the power reference rail 1312 to the transmission line 1308 itself, as illustrated. In this manner the programmable resistance circuit 1400 may remain disconnected from the transmission line 1308 if the uniform memory die is powered off, not activated, or not enabled. When a uniform memory die that includes programmable resistance circuit 1400 is powered on, enabled, or activated, the ODT controller 1314 may activated one or more of the set of switches 1402 and set of switches 1306 to provide a programmatically determined termination resistance. The on-die termination resistance circuit may comprise a programmable resistance circuit configured from the illustrated components to provide a termination resistance during transmission of a data signal to a target uniform memory die.

Figure 15:
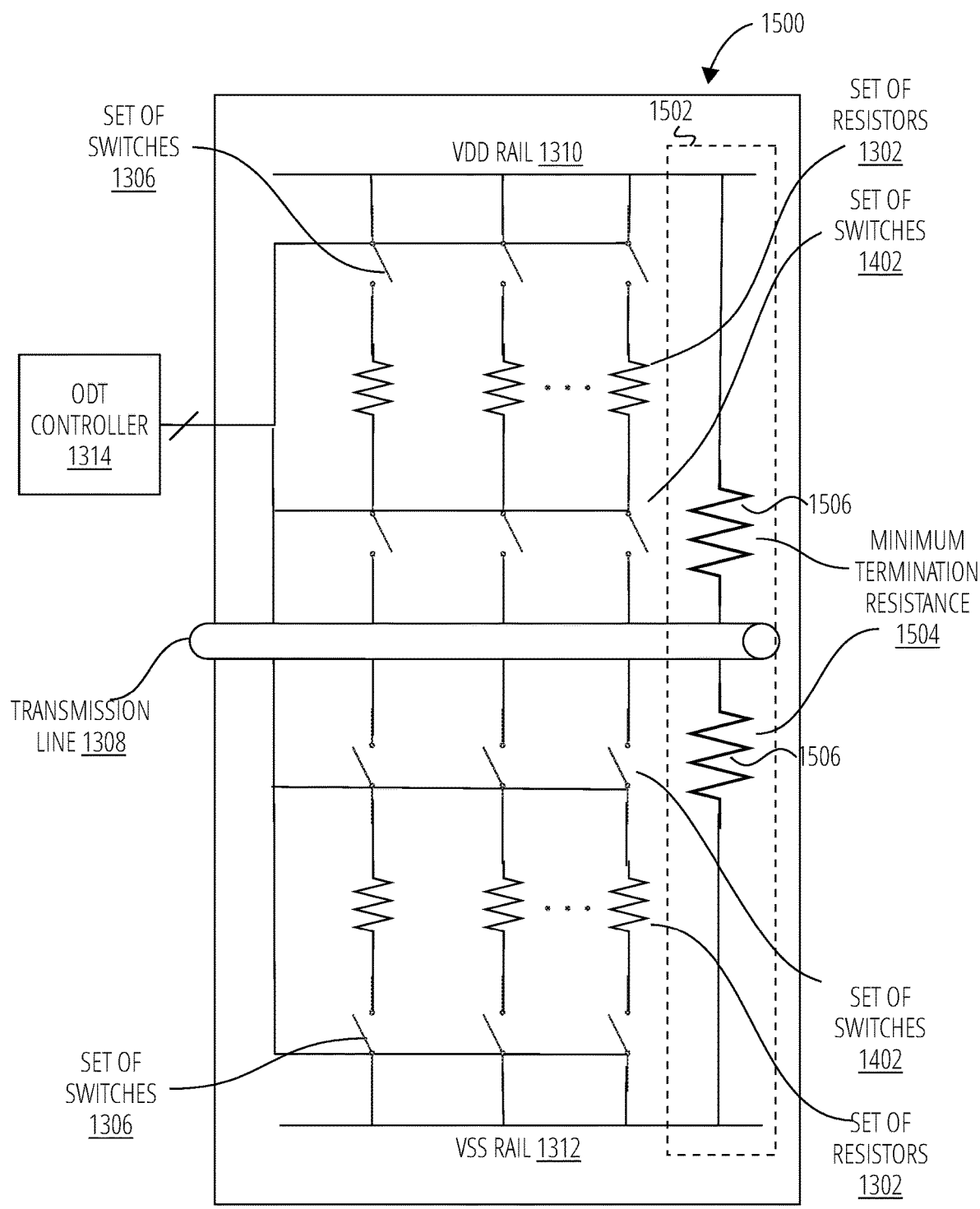
FIG. 15 illustrates programmable resistance circuit 1500 in accordance with one embodiment.

FIG. 15 illustrates an exemplary arrangement of programmable resistance circuit 1500 that may be used to reduce mismatch reflections and improve the signal integrity and bandwidth of high-bandwidth transmission lines. The programmable resistance circuit 1500 may be similar to the programmable resistance circuit 1300 of FIG. 13 or programmable resistance circuit 1400 of FIG. 14. In one embodiment, the set of resistors 1302, set of switches 1306, and set of switches 1402, configured by the ODT controller 1314, may comprise an active resistance circuit.

One difference in the embodiment of FIG. 15 in relation to the embodiments of FIG. 13 and FIG. 14 is that the programmable resistance circuit 1500 may include a passive resistance circuit 1502 that is constantly connected to the transmission line 1308. "Passive resistance circuit" refers to a type of on-die termination resistance circuit that uses primarily passive electronic components. Examples of the active electronic components include resistors, capacitors, memristors, and/or transducers. An example passive resistance circuit may include a single resistor. The passive resistance circuit 1502 may include one or more resistive elements 1506 and the passive resistance circuit 1502 may be configured to provide no less termination resistance than a minimum termination resistance. The resistive elements 1506 may comprise one or more electronic components configured to provide the minimum termination resistance to the transmission path during operations when the uniform memory die is powered off and the uniform memory die is connected to the transmission line.

In addition to the set of resistors 1302, configurable through implementation of the set of switches 1306 and/or set of switches 1402 to provide a higher termination resistance, the passive resistance circuit 1502 provides a minimum termination resistance 1504. The passive resistance circuit 1502, in one embodiment, may be connected between the transmission line 1308 and power rail 1310, as well as between the transmission line 1308 and power reference rail 1312 as shown. Because the passive resistance circuit 1502 is always connected to the transmission line 1308, the programmable resistance circuit 1500 provides a minimum termination resistance 1504 based on the configuration of the passive resistance circuit 1502. In one embodiment, the minimum termination resistance 1504 may comprise a termination resistance of at least 100Ω and/or no less than 200Ω.

Figure 16:
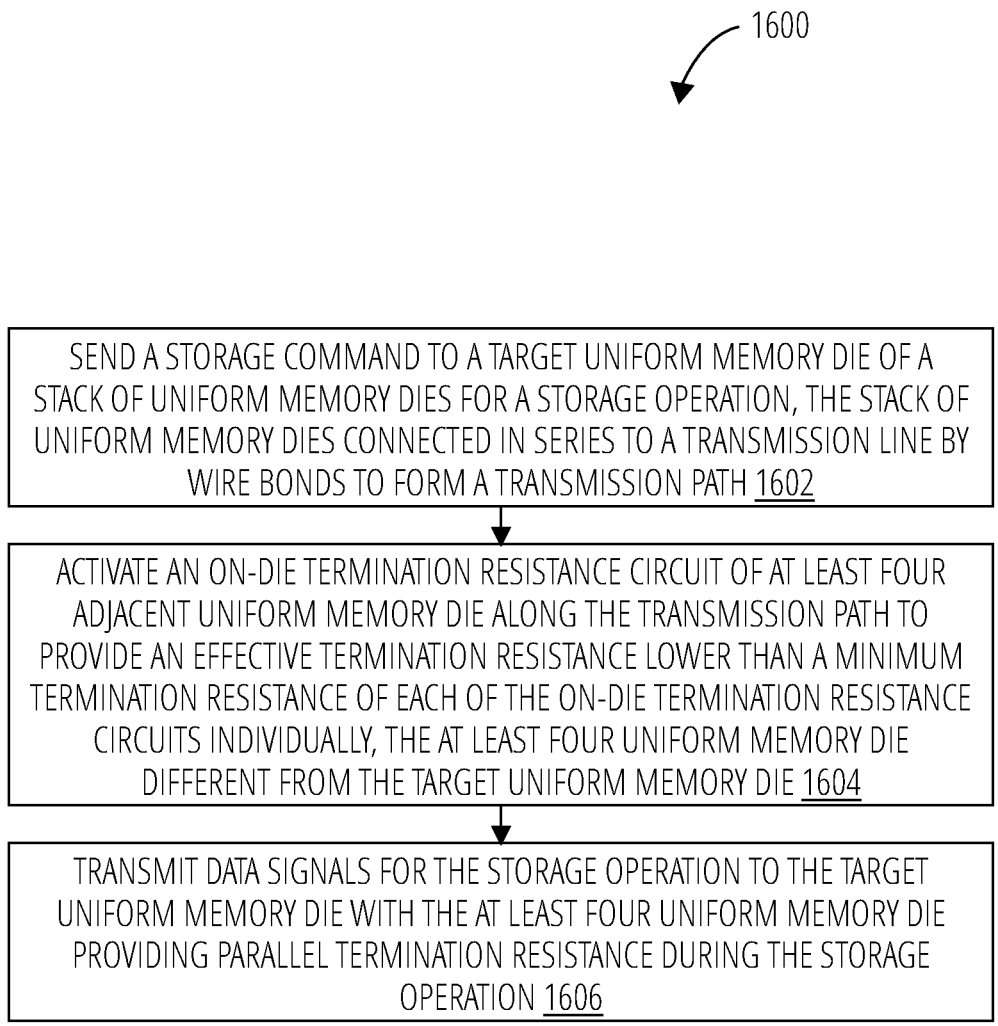
FIG. 16 illustrates a method for providing electrical termination 1600 in accordance with one embodiment.

FIG. 16 illustrates a method for providing electrical termination 1600 for providing transmission line termination in accordance with one embodiment. In block 1602, a storage controller or some other logical component may send a storage command to a target uniform memory die of a stack of uniform memory dies for an operation. The stack of uniform memory dies may connect in series to a transmission line using wire bonds to form a transmission path.

In block 1604, an on-die termination resistance circuit of at least four adjacent uniform memory die along the transmission path may be activated to provide an effective termination resistance lower than a minimum termination resistance of each of the on-die termination resistance circuits individually. This may be performed in one embodiment by the storage controller. The at least four uniform memory die may be different from the target uniform memory die of block 1602. In one embodiment, the at least four uniform memory dies along the transmission path may be the last uniform memory dies along the transmission path.

In block 1606, the storage controller or similar logic may transmit data signals for the operation to the target uniform memory die. The at least four uniform memory die may provide parallel termination resistance during the operation. "Parallel termination resistance" refers to a circuit, apparatus, device, or logic configured to provide termination resistance by way of a parallel electrical connection to a transmission path.

It is intended that the foregoing detailed description be understood as an illustration of selected forms and aspects that embodiments of the solution can take. Finally, it should be noted that any aspect of any of the embodiments described herein can be used alone or in combination with any other.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. An apparatus, comprising:
    a stack of uniform memory dies coupled to a transmission line by a set of wire bonds that connect each uniform memory die of the stack of uniform memory dies in series to form a transmission path;
    each memory die of the stack of uniform memory dies comprising:
        an on-die termination resistance circuit connected to the transmission line, the on-die termination resistance circuit configured to provide a minimum termination resistance; and
    a storage controller configured to:
        address a target uniform memory die of the stack of uniform memory dies for an operation;
        enable the on-die termination resistance circuits of a plurality of uniform memory dies along the transmission path; and
        transmit a data signal for the operation to the target uniform memory die with the on-die termination resistance circuit enabled for the plurality of uniform memory dies.

2. The apparatus of claim 1, wherein the storage controller is configured to transmit the data signal at a frequency greater than 1600 Hz and wherein the plurality of uniform memory dies comprises four uniform memory dies.

3. The apparatus of claim 1, wherein the stack of uniform memory dies comprises more than four uniform memory die and wherein the plurality of uniform memory dies comprises more than two uniform memory dies.

4. The apparatus of claim 1, wherein the on-die termination resistance circuit comprises a passive resistance circuit.

5. The apparatus of claim 1, wherein the on-die termination resistance circuit comprises an active resistance circuit.

6. The apparatus of claim 1, wherein the on-die termination resistance circuit comprises a programmable resistance circuit.

7. The apparatus of claim 6, wherein the programmable resistance circuit comprises a parallel circuit of a set of resistors and a set of switches configured to be activated by a die controller of the plurality of uniform memory dies based on a programmable resistance setting stored in a register of the die controller.

8. The apparatus of claim 1, wherein the minimum termination resistance is configured such that a parasitic capacitance contributed by each of the uniform memory dies in the stack of uniform memory dies is reduced by 25%.

9. The apparatus of claim 1, wherein the minimum termination resistance comprises a termination resistance of at least 100 ohms.

10. The apparatus of claim 1, wherein the minimum termination resistance comprises a termination resistance of no less than 200 ohms.

11. The apparatus of claim 1, wherein the plurality of uniform memory dies are positioned adjacent to each other at an end of the transmission path.

12. The apparatus of claim 1, wherein enabling the on-die termination resistance circuits of the plurality of uniform memory dies creates an effective termination resistance for the transmission path that is less than the minimum termination resistance of anyone of the uniform memory dies individually of the stack of uniform memory dies.

13. The apparatus of claim 1, wherein the transmission line comprises a single-ended transmission line.

14. The apparatus of claim 1, wherein the transmission line comprises a differential transmission line.

15. An apparatus, comprising:
    a stack of uniform memory dies coupled to a transmission line by a set of wire bonds that connect each uniform memory die of the stack of uniform memory dies in series to form a transmission path;
    each uniform memory die of the stack of uniform memory dies comprising:
        an on-die termination resistance circuit configured to connect to the transmission line when a uniform memory die is powered on, the on-die termination resistance circuit comprising a programmable resistance circuit configured to provide a termination resistance during transmission of a data signal to a target uniform memory die; and
    a storage controller configured to:
        send a storage command to a target uniform memory die of the stack of uniform memory dies for an operation;
        direct at least four uniform memory die along the transmission path to provide termination resistance during a portion of the operation, the at least four uniform memory die different from the target uniform memory die; and
        transmit a plurality of data signals for the operation to the target uniform memory die with the at least four uniform memory die generating an effective termination resistance for the transmission path during the operation.

16. The apparatus of claim 15, wherein the stack of uniform memory dies comprises eight uniform memory die and the at least four uniform memory die programmed to provide 200 ohms of termination resistance which is greater than a minimum termination resistance that is 100 ohms.

17. The apparatus of claim 15, wherein the at least four uniform memory die directed to provide termination resistance during the operation provide a distributed termination resistance that substantially matches a characteristic impedance of the transmission line and wherein the programmable resistance circuit is configured to provide a range of termination resistance between the minimum termination resistance and a maximum termination resistance.

18. A method, comprising:
sending a storage command to a target uniform memory die of a stack of uniform memory dies for an operation, the stack of uniform memory dies connected in series to a transmission line by wire bonds to form a transmission path;
activating an on-die termination resistance circuit of at least four adjacent uniform memory die along the transmission path to provide an effective termination resistance lower than a minimum termination resistance of each of the on-die termination resistance circuits individually, the at least four uniform memory die different from the target uniform memory die; and
transmitting data signals for the operation to the target uniform memory die with the at least four uniform memory die providing parallel termination resistance during the operation.

19. The method of claim 18, wherein the at least four adjacent uniform memory die comprise the last uniform memory die along the transmission path.

20. The method of claim 18, wherein the on-die termination resistance circuit comprises at least one electronic component comprising hardware configured to provide the minimum termination resistance to the transmission path during operations when the uniform memory die is powered off and is connected to the transmission line.

* * * * *